United States Patent
Lee et al.

(10) Patent No.: US 11,004,909 B2
(45) Date of Patent: May 11, 2021

(54) PHOTOELECTRIC DIODES INCLUDING PHOTOELECTRIC CONVERSION LAYER AND COMPENSATION LATER, AND ORGANIC SENSORS AND ELECTRONIC DEVICES INCLUDING SAME

(71) Applicant: Samsung Electronics Co., Ltd., Suwon-si (KR)

(72) Inventors: Kwang Hee Lee, Hwaseong-si (KR); Takkyun Ro, Hwaseong-si (KR); Dong-Seok Leem, Seongnam-si (KR); Ohkyu Kwon, Seoul (KR); Bum Woo Park, Hwaseong-si (KR); Hyesung Choi, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/536,879

(22) Filed: Aug. 9, 2019

(65) Prior Publication Data

US 2020/0235168 A1 Jul. 23, 2020

(30) Foreign Application Priority Data

Jan. 22, 2019 (KR) .................. 10-2019-0008330

(51) Int. Cl.
*H01L 27/32* (2006.01)
*H01L 27/28* (2006.01)

(52) U.S. Cl.
CPC .......... *H01L 27/322* (2013.01); *H01L 27/288* (2013.01); *H01L 27/3209* (2013.01)

(58) Field of Classification Search
CPC . H01L 27/322; H01L 27/288; H01L 27/3209; H01L 51/0094; H01L 51/0077;

(Continued)

(56) References Cited

U.S. PATENT DOCUMENTS 7,863,605 B2  1/2011  Hayashi
8,288,939 B2  10/2012  Hayashi (Continued)

FOREIGN PATENT DOCUMENTS

CN  103531711 B  5/2016
EP  3509108 A1  7/2019

(Continued)

OTHER PUBLICATIONS

Haruto Maruhashi et al: "Fabrication and characterization of silicon naphthalocyanine/fullerene-based photovoltaic devices with inverted structures", Proc. Int. Conf. and Summer School on Advanced Silicide Technology, 2014, Jul. 10, 2014 (Jul. 10, 2014), p. 011405, XP055703834, DOI: 10.7567/JJAPCP.3.011405.*

(Continued)

*Primary Examiner* — Mohammad M Hoque
(74) *Attorney, Agent, or Firm* — Harness, Dickey & Pierce, P.L.C.

(57) ABSTRACT

A photoelectric diode includes a first electrode and a second electrode facing each other; a photoelectric conversion layer between the first electrode and the second electrode, and a compensation layer on the photoelectric conversion layer, the compensation layer being configured to compensate absorption and reflection of light. The photoelectric conversion layer is associated with a first optical spectrum having a light-absorption peak at a first wavelength and a reflection peak at a second wavelength, the first wavelength and the second wavelength both within a wavelength region of about 750 nm to about 1200 nm. The photoelectric diode is associated with a second optical spectrum having a light-absorption peak at a third wavelength, the third wavelength is within the wavelength region of about 750 nm to about 1200 nm, the third wavelength different from the first wavelength.

41 Claims, 27 Drawing Sheets

(58) Field of Classification Search
CPC ... H01L 27/302; H01L 27/307; H01L 51/447; H01L 27/14643–14663; H01L 2924/12043; H01L 31/1016; H01L 31/145–153; H01L 31/165–173
USPC .......................................................... 257/40
See application file for complete search history.

(56) References Cited

U.S. PATENT DOCUMENTS

| | | | |
|---|---|---|---|
| 8,476,682 | B2 | 7/2013 | Kim et al. |
| 8,822,980 | B2 | 9/2014 | Hayashi et al. |
| 9,412,952 | B2 | 8/2016 | Fukuzaki et al. |
| 9,484,537 | B2 | 11/2016 | Liang et al. |
| 9,960,353 | B2 | 5/2018 | Liang et al. |
| 2015/0287766 | A1* | 10/2015 | Kim ............... H01L 27/14641 250/208.1 |
| 2015/0372046 | A1 | 12/2015 | Kim et al. |
| 2018/0006090 | A1* | 1/2018 | Leem ................... H01L 27/307 |
| 2019/0214591 | A1 | 7/2019 | Park et al. |

FOREIGN PATENT DOCUMENTS

| | | | |
|---|---|---|---|
| EP | 3582275 | A1 | 12/2019 |
| JP | 2009049278 | A | 3/2009 |
| JP | 2009060051 | A * | 3/2009 |
| JP | 2011155105 | A | 8/2011 |
| JP | 2012015434 | A | 1/2012 |
| JP | 5427349 | B2 | 2/2014 |
| KR | 101641440 | B1 | 7/2016 |
| KR | 101661397 | B1 | 10/2016 |
| KR | 101676974 | B1 | 11/2016 |
| KR | 101844952 | B1 | 4/2018 |
| WO | WO-2018/147202 | A1 | 8/2018 |

OTHER PUBLICATIONS

Ji, Qi_et al., 'Panchromatic small molecules for UV-Vis-NIR photodetectors with high detectivity'. Journal of Materials Chemistry, 2014, pp. 2431-2438.

Binda, M. et al., 'High detectivity squaraine-based near infrared photodetector with nA/cm dark current', Applied Physics Letter, 98, 2011, 073303.

Aoki, H. et al, 'Nanoscale', (2015), 'Near-infrared Absorbing Polymer Nano-particle as a Sensitive Contrast Agent for Photoacoustic Imaging' pp. 1-8, https://pubs.rsc.org/en/content/getauthorversionpdf/c4nr04724a.

Extended European Search Report dated Jul. 16, 2020 for corresponding European Patent Application No. 19206155.4.

* cited by examiner

PHOTOELECTRIC DIODES INCLUDING PHOTOELECTRIC CONVERSION LAYER AND COMPENSATION LATER, AND ORGANIC SENSORS AND ELECTRONIC DEVICES INCLUDING SAME

CROSS-REFERENCE TO RELATED APPLICATION

This application claims priority to and the benefit of Korean Patent Application No. 10-2019-0008330 filed in the Korean Intellectual Property Office on Jan. 22, 2019, the entire contents of which are incorporated herein by reference.

BACKGROUND

1. Field

Photoelectric diodes, organic sensors, and electronic devices are disclosed.

2. Description of the Related Art

Imaging devices are used in digital cameras, camcorders, etc., to capture an image and to store the captured image as an electrical signal, and imaging devices include a sensor that may separate incident light into separate components defined by separate wavelength regions and convert each separate component to an electrical signal. Accordingly, it will be understood that the sensor may detect the incident light in the separate wavelength regions.

In recent years, photoelectric diodes configured to detect light in a near infra-red wavelength region have been studied for improving sensitivity of a sensor in a low-illumination environment or for use as a biometric device.

SUMMARY

Some example embodiments provide a photoelectric diode configured to exhibit improved optical properties and electrical characteristics in a near infra-red wavelength region.

Some example embodiments provide an organic sensor including the photoelectric diode.

Some example embodiments provide an electronic device including the photoelectric diode or the organic sensor.

According to some example embodiments, a photoelectric diode includes a first electrode and a second electrode facing each other; a photoelectric conversion layer between the first electrode and the second electrode, the photoelectric conversion layer associated with a first optical spectrum having a light-absorption peak at a first wavelength and a reflection peak at a second wavelength, the first wavelength and the second wavelength both within a wavelength region of about 750 nm to about 1200 nm; and a compensation layer on the photoelectric conversion layer, the compensation layer configured to compensate light-absorption and reflection characteristics of the photoelectric diode in one or more wavelength regions, wherein the photoelectric diode is associated with a second optical spectrum having a light-absorption peak at a third wavelength, the third wavelength is within the wavelength region of about 750 nm to about 1200 nm, the third wavelength different from the first wavelength.

A difference between the first wavelength and the second wavelength may be less than or equal to about 50 nm.

The third wavelength may be a longer wavelength than the first wavelength.

The third wavelength may be a longer wavelength than the first wavelength by about 5 nm to about 50 nm.

A difference between absorptance and reflectance of the photoelectric diode at the third wavelength may be larger than a difference between absorptance and reflectance of the photoelectric conversion layer at the first wavelength.

The compensation layer may include a charge transporting light-absorbing material.

The compensation layer may be between the second electrode and the photoelectric conversion layer.

The compensation layer may include a first compensation layer including a charge transporting light-absorbing material and a second compensation layer including a material having a refractive index of about 1.5 to about 2.5.

The first compensation layer may be on a first surface of the second electrode and the second compensation layer may be on a second, opposite surface of the second electrode.

The first compensation layer and the second compensation layer may be disposed on the second electrode, respectively.

The photoelectric conversion layer may include an organic light-absorbing material, the organic light-absorbing material associated with a third optical spectrum having a light-absorption peak at a fifth wavelength and a reflection peak at a fifth wavelength, the fifth wavelength and the sixth wavelength within the wavelength region of about 750 nm to about 1200 nm. A difference between the fifth wavelength and the sixth wavelength is less than or equal to about 50 nm.

The fifth wavelength and the sixth wavelength may be within a wavelength region of about 750 nm to about 850 nm.

The first wavelength and the second wavelength may be within a wavelength region of about 750 nm to about 850 nm, respectively.

The third wavelength may be within a wavelength region of about 755 nm to about 900 nm.

According to some example embodiments, a photoelectric diode includes a first electrode, a photoelectric conversion layer including an organic light-absorbing material, and second electrode, wherein the photoelectric conversion layer is associated with a first optical spectrum having a light-absorption peak at a first wavelength and a reflection peak at a second wavelength, the first wavelength and the second wavelength both within a wavelength region of about 750 nm to about 1200 nm, wherein the photoelectric diode further includes a compensation layer on the photoelectric conversion layer, wherein the photoelectric diode is associated with a second optical spectrum having a light-absorption peak at a third wavelength within the wavelength region of about 750 nm to about 1200 nm, and a difference between absorptance and reflectance of the photoelectric diode at the third wavelength is larger than a difference between absorptance and reflectance of the photoelectric conversion layer at the first wavelength.

A difference between the first wavelength and the second wavelength may be less than or equal to about 50 nm.

The first wavelength and the second wavelength may be within a wavelength region of about 750 nm to about 850 nm.

The third wavelength may be within a wavelength region of about 755 nm to about 900 nm.

The organic light-absorbing material may be associated with a third optical spectrum having a light-absorption peak at a fifth wavelength and a reflection peak at a sixth wavelength, the fifth wavelength and the sixth wavelength within the wavelength region of about 750 nm to about 1200 nm. A difference between the fifth wavelength and the sixth wavelength may be less than or equal to about 50 nm.

The fifth wavelength and the sixth wavelength may be within a wavelength region of about 750 nm to about 850 nm.

The compensation layer may include a charge transporting light-absorbing material.

The compensation layer may include a first compensation layer including a charge transporting light-absorbing material and a second compensation layer including a material having a refractive index of about 1.5 to about 2.5.

The first compensation layer may be between the photoelectric conversion layer and the second electrode and may be on a first surface of the second electrode, and the second compensation layer may be on a second, opposite surface of the second electrode.

The first compensation layer and the second compensation layer may be on a common surface of the second electrode, and the first compensation layer may be between the second electrode and the second compensation layer.

According to some example embodiments, an organic sensor including the photoelectric diode is provided.

According to some example embodiments, an electronic device including the photoelectric diode or the organic sensor is provided.

According to some example embodiments, an organic sensor may include a semiconductor substrate and a first photoelectric diode on the semiconductor substrate. The first photoelectric diode may be configured to absorb and convert a particular wavelength spectrum of incident light into electric signals. The first photoelectric diode may include a first electrode and a second electrode facing each other, a photoelectric conversion layer between the first electrode and the second electrode, the photoelectric conversion layer associated with a first optical spectrum having a light-absorption peak at a first wavelength and a reflection peak at a second wavelength, the first wavelength and the second wavelength both within a wavelength region of about 750 nm to about 1200 nm, and a compensation layer on the photoelectric conversion layer. The first photoelectric diode may be associated with a second optical spectrum having a light-absorption peak at a third wavelength. The third wavelength may be within the wavelength region of about 750 nm to about 1200 nm. The third wavelength may be different from the first wavelength. A difference between absorptance and reflectance of the first photoelectric diode at the third wavelength may be larger than a difference between absorptance and reflectance of the photoelectric conversion layer at the first wavelength.

The organic sensor may further include a plurality of photoelectric diodes on the semiconductor substrate. Each photoelectric diode of the plurality of photoelectric diodes may be configured to absorb and convert a different wavelength spectrum of incident light into electric signals. The plurality of photoelectric diodes may include the first photoelectric diode.

The plurality of photoelectric diodes may be stacked vertically on the semiconductor substrate, such that the plurality of photoelectric diodes overlap each other in a direction extending perpendicular to a top surface of the semiconductor substrate.

One photoelectric diode of the plurality of photoelectric diodes may overlap with a limited portion of another photoelectric diode of the plurality of photoelectric diodes in the direction extending perpendicular to the top surface of the semiconductor substrate.

The plurality of photoelectric diodes may be arranged horizontally on the semiconductor substrate, such that the plurality of photoelectric diodes overlap each other in a direction extending parallel to a top surface of the semiconductor substrate.

The particular wavelength spectrum of incident light may include an infrared or near-infrared wavelength spectrum of incident light.

The organic sensor may further include a photo-sensing device integrated in the semiconductor substrate. The photo-sensing device may be configured to convert a separate wavelength spectrum of incident light into electric signals.

The organic sensor may further include a color filter configured to selectively transmit another wavelength spectrum of incident light to the photo-sensing device. The another wavelength spectrum of incident light may include at least the separate wavelength spectrum of incident light, such that the photo-sensing device is configured to absorb the separate wavelength spectrum of incident light.

The first photoelectric diode may be between the color filter and the photo-sensing device.

The photo-sensing device may be between the color filter and the first photoelectric diode.

An electronic device may include the organic sensor.

According to some example embodiments, a photoelectric diode may include a first electrode and a second electrode facing each other, and a photoelectric conversion layer between the first electrode and the second electrode. The photoelectric conversion layer may be associated with a first optical spectrum having a light-absorption peak at a first wavelength and a reflection peak at a second wavelength. The first wavelength and the second wavelength may be both within a wavelength region of about 750 nm to about 1200 nm. The photoelectric diode may be associated with a second optical spectrum having a light-absorption peak at a third wavelength. The third wavelength may be within the wavelength region of about 750 nm to about 1200 nm. The third wavelength may be different from the first wavelength. A difference between absorptance and reflectance of the photoelectric diode at the third wavelength may be larger than a difference between absorptance and reflectance of the photoelectric conversion layer at the first wavelength.

The second electrode may be configured to compensate light-absorption and reflection characteristics of the photoelectric diode in one or more wavelength regions.

The second electrode may include a charge transporting light-absorbing material.

The second electrode may further include a material having a refractive index of about 1.5 to about 2.5.

The photoelectric diode may further include a compensation layer on the photoelectric conversion layer. The compensation layer may be configured to compensate light-absorption and reflection characteristics of the photoelectric diode in one or more wavelength regions.

A difference between the first wavelength and the second wavelength may be less than or equal to about 50 nm.

The third wavelength may be a longer wavelength than the first wavelength.

The third wavelength may be a longer wavelength than the first wavelength by about 5 nm to about 50 nm.

A difference between absorptance and reflectance of the photoelectric diode at the third wavelength may be larger than a difference between absorptance and reflectance of the photoelectric conversion layer at the first wavelength.

The photoelectric conversion layer may include an organic light-absorbing material. The organic light-absorbing material may be associated with a third optical spectrum having a light-absorption peak at a fifth wavelength and a reflection peak at a sixth wavelength. The fifth wavelength and the sixth wavelength may be within the wavelength region of about 750 nm to about 1200 nm. A difference between the fifth wavelength and the sixth wavelength may be less than or equal to about 50 nm.

The fifth wavelength and the sixth wavelength may be within a wavelength region of about 750 nm to about 850 nm.

The photoelectric diode may exhibit improved optical properties and electrical characteristics.

DETAILED DESCRIPTION

Figure 1:
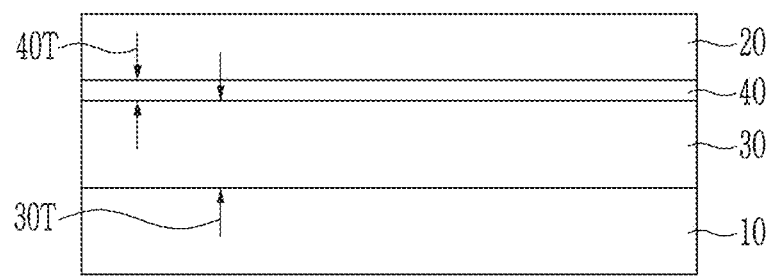
FIG. 1 is a cross-sectional view of a photoelectric diode according to some example embodiments.

Hereinafter, some example embodiments of the present disclosure will be described in detail so that a person skilled in the art would understand the same. However, this disclosure may be embodied in many different forms and is not to be construed as limited to the example embodiments set forth herein.

In the drawings, the thickness of layers, films, panels, regions, etc., are exaggerated for clarity.

It will be understood that when an element such as a layer, film, region, or substrate is referred to as being "on" another element, it may be directly on the other element or intervening elements may also be present. In contrast, when an element is referred to as being "directly on" another element, there are no intervening elements present.

Hereinafter, a photoelectric diode (i.e., "photoelectric device," "photoelectric conversion device," or the like) according to some example embodiments is described.

FIG. 1 is a cross-sectional view of a photoelectric diode according to some example embodiments.

Referring to FIG. 1, a photoelectric diode 100 according to some example embodiments includes a first electrode 10 and a second electrode 20 facing each other, a photoelectric conversion layer 30 between the first electrode 10 and the second electrode 20, and a compensation layer 40 on the photoelectric conversion layer 30.

A substrate (not shown) may be disposed at the side of the first electrode 10 or the second electrode 20. The substrate may be in some example embodiments made of an inorganic material such as glass; an organic material such as polycarbonate, polymethylmethacrylate, polyethyleneterephthalate, polyethylenenaphthalate, polyamide, polyethersulfone, or a combination thereof; or a silicon wafer. The substrate may be an encapsulation substrate. The substrate may be omitted.

One of the first electrode 10 and the second electrode 20 is an anode and the other is a cathode. In some example embodiments, the first electrode 10 may be an anode and the second electrode 20 may be a cathode. In some example embodiments, the first electrode 10 may be a cathode and the second electrode 20 may be an anode.

The first electrode 10, the second electrode 20, or both the first electrode 10 and the second electrode 20 may be a light-transmitting electrode and the light-transmitting electrode may be in some example embodiments made of a conductive oxide such as an indium tin oxide (ITO), indium zinc oxide (IZO), zinc oxide (ZnO), tin oxide (SnO), aluminum tin oxide (AITO), and fluorine doped tin oxide (FTO), or a metal thin layer of a single layer or a multilayer. When one of the first electrode 10 and the second electrode 20 is a non-light-transmitting electrode, the non-light-transmitting electrode may be made of in some example embodiments an opaque conductor such as aluminum (Al), silver (Ag), or gold (Au). In some example embodiments, both the first electrode 10 and the second electrode 20 may be light-transmitting electrodes. In some example embodiments, the second electrode 20 may be a light receiving electrode disposed at a light receiving side.

The photoelectric conversion layer 30 may be configured to absorb incident light in a near infra-red wavelength region and perform photoelectric conversion of the absorbed incident light, and a light-absorption spectrum of the photoelectric conversion layer 30 (e.g., a wavelength region of incident light that may be absorbed by the photoelectric conversion layer 30) may have a light absorption peak at a first wavelength within a near infra-red wavelength region. Restated, the photoelectric conversion layer 30 may be associated with an optical spectrum (e.g., a first optical spectrum) that has a light-absorption peak at a first wavelength. The first wavelength may in some example embodiments belong to ("are within") a wavelength region of greater than about 700 nm, greater than or equal to about 720 nm, greater than or equal to about 730 nm, or greater than or equal to about 750 nm, within the ranges in some example embodiments greater than about 700 nm and less than or equal to about 3000 nm, about 720 nm to about 3000 nm, about 730 nm to about 3000 nm, about 750 nm to about 3000 nm, about 750 nm to about 2500 nm, about 750 nm to about 2200 nm, about 750 nm to about 2100 nm, about 750 nm to about 2000 nm, about 750 nm to about 1800 nm, about 750 nm to about 1500 nm, about 750 nm to about 1300 nm, about 750 nm to about 1200 nm, about 750 nm to about 1100 nm, about 750 nm to about 1000 nm, about 750 nm to about 950 nm, about 750 nm to about 900 nm, or about 750 nm to about 850 nm. In some example embodiments, the first wavelength may belong to ("may be within") a wavelength region of about 750 nm to about 1200 nm, in some example embodiments about 750 nm to about 950 nm, about 750 nm to about 900 nm, or about 750 nm to about 850 nm.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

In some example embodiments, a reflection spectrum of the photoelectric conversion layer 30 (e.g., a wavelength region of incident light that may be reflected by the photoelectric conversion layer 30) may have a reflection peak at a second wavelength within a near infra-red wavelength region. Restated, the photoelectric conversion layer 30 may be associated with an optical spectrum that has a reflection peak at a second wavelength. Accordingly, the photoelectric conversion layer 30 may be associated with an optical spectrum (e.g., a first optical spectrum) that has a light-absorption peak at a first wavelength and a reflection peak at a second wavelength. The second wavelength may be the same as or different from the first wavelength. In some example embodiments, the second wavelength may belong to a wavelength region of greater than about 700 nm, greater than or equal to about 720 nm, greater than or equal to about 730 nm, or greater than or equal to about 750 nm, within the ranges in some example embodiments greater than about 700 nm and less than or equal to about 3000 nm, about 720 nm to about 3000 nm, about 730 nm to about 3000 nm, about 750 nm to about 3000 nm, about 750 nm to about 2500 nm, about 750 nm to about 2200 nm, about 750 nm to about 2100 nm, about 750 nm to about 2000 nm, about 750 nm to about 1800 nm, about 750 nm to about 1500 nm, about 750 nm to about 1300 nm, about 750 nm to about 1200 nm, about 750 nm to about 110 nm, about 750 nm to about 1000 nm, about 750 nm to about 950 nm, about 750 nm to about 900 nm, or about 750 nm to about 850 nm.

In some example embodiments, a difference between the first wavelength and the second wavelength may be less than or equal to about 50 nm, in some example embodiments about 1 nm to about 50 nm, about 3 nm to about 50 nm, or about 5 nm to about 50 nm.

In some example embodiments, the first wavelength and the second wavelength may commonly belong to a common wavelength region of about 750 nm to about 1500 nm, about 750 nm to about 1300 nm, about 750 nm to about 1200 nm, about 750 nm to about 1100 nm, about 750 nm to about 1000 nm, about 750 nm to about 950 nm, about 750 nm to about 900 nm, or about 750 nm to about 850 nm.

Optical properties of such a photoelectric conversion layer 30 may be exhibited according to a combination of optical properties of light-absorbing materials in the photoelectric conversion layer 30 and at least one light-absorbing material of the light-absorbing materials may be, in some example embodiments, an organic light-absorbing material. In some example embodiments, a light-absorption spectrum of the light-absorbing materials in the photoelectric conversion layer 30 may have a light-absorption peak at a fifth wavelength, the fifth wavelength may be the same as or different from the first wavelength. Restated, the organic light-absorbing material of the photoelectric conversion layer 30 may be associated with an optical spectrum (e.g., a third optical spectrum) that has a light-absorption peak at a fifth wavelength. In some example embodiments, the fifth wavelength may belong to a wavelength region of greater than about 700 nm, greater than or equal to about 720 nm, greater than or equal to about 730 nm, or greater than or equal to about 750 nm, within the ranges in some example embodiments greater than about 700 nm and less than or equal to about 3000 nm, about 720 nm to about 3000 nm, about 730 nm to about 3000 nm, about 750 nm to about 3000 nm, about 750 nm to about 2500 nm, about 750 nm to about 2200 nm, about 750 nm to about 2100 nm, about 750 nm to about 2000 nm, about 750 nm to about 1800 nm, about 750 nm to about 1500 nm, about 750 nm to about 1300 nm, about 750 nm to about 1200 nm, about 750 nm to about 1100 nm, about 750 nm to about 1000 nm, about 750 nm to about 950 nm, about 750 nm to about 900 nm, or about 750 nm to about 850 nm. In some example embodiments, the first wavelength may belong to a wavelength region of about 750 nm to about 1200 nm, in some example embodiments about 750 nm to about 950 nm, about 750 nm to about 900 nm, or about 750 nm to about 850 nm.

In some example embodiments, a part of the light-absorbing material may exhibit relatively high absorptance and relatively high reflectance simultaneously in a near infra-red wavelength region. In some example embodiments, at least one light-absorbing material of the light-absorbing materials may exhibit a light-absorption spectrum and a reflection spectrum which overlap with each other in the near infra-red wavelength region. In some example embodiments, as described above, the light-absorption spectrum may have a light-absorption peak at the fifth wavelength belonging to the near infra-red wavelength region, and the reflection spectrum may have a reflection peak at the sixth wavelength belonging to the near infra-red wavelength region. Restated, the organic light-absorbing material of the photoelectric conversion layer 30 may be associated with an optical spectrum that has a reflection peak at a sixth wavelength. Accordingly, the organic light-absorbing material of the photoelectric conversion layer 30 may be associated with an optical spectrum (e.g., a third optical spectrum) that has a light-absorption peak at a fifth wavelength and a reflection peak at a sixth wavelength. The optical spectrum of the organic light-absorbing material may be different from the optical spectrum of the photoelectric conversion layer 30 and/or the optical spectrum of the photoelectric diode 100. The sixth wavelength may be the same as or different from the fifth wavelength, and may in some example embodiments belong to a wavelength region of greater than about 700 nm, about greater than or equal to about 720 nm, greater than or equal to about 730 nm, or greater than or equal to about 750 nm, within the ranges, in some example embodiments greater than about 700 nm and less than or equal to about 3000 nm, about 720 nm to about 3000 nm, about 730 nm to about 3000 nm, about 750 nm to about 3000 nm, about 750 nm to about 2500 nm, about 750 nm to about 2200 nm, about 750 nm to about 2100 nm, about 750 nm to about 2000 nm, about 750 nm to about 1800 nm, about 750 nm to about 1500 nm, about 750 nm to about 1300 nm, about 750 nm to about 1200 nm, about 750 nm to about 110 nm, about 750 nm to about 1000 nm, about 750 nm to about 950 nm, about 750 nm to about 900 nm, or about 750 nm to about 850 nm.

In some example embodiments, a difference between the fifth wavelength and the sixth wavelength may be less than or equal to about 50 nm, in some example embodiments about 1 nm to about 50 nm, about 3 nm to about 50 nm, or about 5 nm to about 50 nm.

In some example embodiments, the fifth wavelength and the sixth wavelength may commonly belong to a common wavelength region of about 750 nm to about 1500 nm, about 750 nm to about 1300 nm, about 750 nm to about 1200 nm, about 750 nm to about 1100 nm, about 750 nm to about 1000 nm, about 750 nm to about 950 nm, about 750 nm to about 900 nm, or about 750 nm to about 850 nm.

The light-absorbing material may be in some example embodiments selected from a quantum dot, a quinoid metal complex compound, a cyanine compound, an immonium compound, a diimmonium compound, a triarylmethane compound, a dipyrromethene compound, a diquinone compound, a naphthoquinone compound, an anthraquinone compound, a squarylium compound, a rylene compound, a phthalocyanine compound, a naphthalocyanine compound, a perylene compound, a quaraine compound, a boron-dipyrromethene compound, a nickel-dithiol complex, merocyanine, diketopyrrolopyrroles, a croconium compound, a derivative thereof, or a combination thereof, but is not limited thereto.

In some example embodiments, the light-absorbing material may be a cyanine compound or a derivative thereof, in some example embodiments, phthalocyanine or a derivative thereof, naphthalocyanine, or a derivative thereof.

In some example embodiments, the light-absorbing material may be represented by Chemical Formula 1, but is not limited thereto.

[Chemical Formula 1]

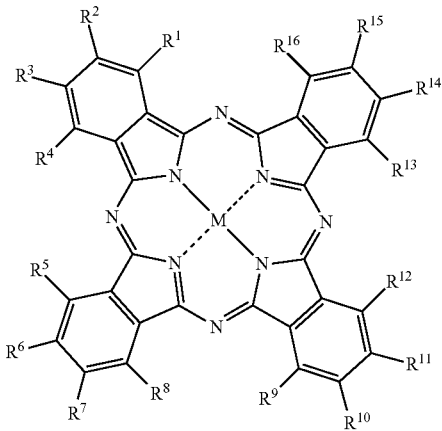

In Chemical Formula 1,

M is $M^1$ or $M^1X_2$ (wherein $M^1$ is a metal or a semi-metal; X is a halide or $OR^a$, wherein $R^a$ is hydrogen, a substituted or unsubstituted C1 to C20 alkyl group, a substituted or unsubstituted C6 to C20 aryl group, or a substituted or unsubstituted silyl group), $R^1$ to $R^{16}$ are independently hydrogen, a substituted or unsubstituted C1 to C20 alkyl group, a substituted or unsubstituted C1 to C20 alkoxy group, a substituted or unsubstituted C6 to C20 aryl group, a substituted or unsubstituted C3 to C20 heteroaryl group, a halogen, a cyano group, or a combination thereof, and $R^1$ to $R^{16}$ may be independently present or adjacent two may be linked with each other to form a ring.

In some example embodiments, $M^1$ may be Si, Mg, Al, or Sn.

In some example embodiments, $R^2$ and $R^3$, $R^6$ and $R^7$, $R^{10}$ and $R^{11}$, and $R^{14}$ and $R^{15}$ may be linked with each other to form a benzene ring.

The photoelectric conversion layer 30 may be a layer including at least one p-type semiconductor and at least one n-type semiconductor to provide a pn junction and the layer may generate excitons by receiving light from outside and then may separate holes and electrons from the generated excitons.

The p-type semiconductor and the n-type semiconductor may be a light-absorbing material that being configured to absorb at least one part of a wavelength region respectively. The p-type semiconductor, the n-type semiconductor, or both the p-type semiconductor and the n-type semiconductor may be the aforementioned light-absorbing material. In some example embodiments, the p-type semiconductor may be the aforementioned light-absorbing material and the n-type semiconductor may be fullerene or a fullerene derivative. Herein, the fullerene may be in some example embodiments C60, C70, C74, C76, or C78.

The photoelectric conversion layer 30 may include an intrinsic layer in which a p-type semiconductor and an n-type semiconductor are co-deposited. Herein, the p-type semiconductor and the n-type semiconductor may be included in a volume ratio (or thickness ratio) of about 1:9 to about 9:1, in some example embodiments about 2:8 to about 8:2, about 3:7 to about 7:3, about 4:6 to about 6:4, or about 5:5.

The photoelectric conversion layer 30 may further include a p-type layer and/or an n-type layer in addition to the intrinsic layer. The p-type layer may include the aforementioned p-type semiconductor and the n-type layer may include the aforementioned n-type semiconductor. In some example embodiments, they may be included in various combinations of p-type layer/I layer, I layer/n-type layer, p-type layer/I layer/n-type layer, and the like.

A thickness of the photoelectric conversion layer 30 may be about 100 nm to about 500 nm, about 150 nm to about 500 nm, about 200 nm to about 500 nm, or about 230 nm to about 500 nm.

The compensation layer 40 may be disposed at the light incident direction of the photoelectric diode 100. In some example embodiments, when the second electrode 20 is a light-receiving electrode, the compensation layer 40 may be disposed on the photoelectric conversion layer 30, in some example embodiments between the second electrode 20 and the photoelectric conversion layer 30. But, it will be understood that the compensation layer 40 may be in a position that is other than between the second electrode 20 and the photoelectric conversion layer 30. The compensation layer 40 may be configured to compensate light-absorption and reflection characteristics of the photoelectric diode 100 in one or more wavelength regions (e.g., a near infra-red wavelength region).

Optical properties of the photoelectric diode 100 may be exhibited by a combination of optical properties of the aforementioned photoelectric conversion layer 30 and optical properties of the compensation layer 40. Accordingly, the optical properties of the photoelectric diode 100 may be different from the optical properties of the photoelectric conversion layer 30 by the compensation layer 40. In some example embodiments, an optical spectrum of the photoelectric diode 100 (e.g., a second optical spectrum) may be different from an optical spectrum of the photoelectric conversion layer 30.

In some example embodiments, a light-absorption spectrum of the photoelectric diode 100 may be different from a light-absorption spectrum of the photoelectric conversion layer 30. The light-absorption spectrum of the photoelectric diode 100 may have a light-absorption peak at a third wavelength within a near infra-red wavelength region and the third wavelength may be different from the first wavelength that is a light-absorption peak wavelength of the aforementioned photoelectric conversion layer 30. Accordingly, the photoelectric diode 100 may be associated with a separate optical spectrum (e.g., a second optical spectrum) that is separate from the optical spectrum of the photoelectric conversion layer 30 and which has a light-absorption peak at a third wavelength. In some example embodiments, the third wavelength may be a longer wavelength than the first wavelength. The third wavelength may be, in some example embodiments, a longer wavelength than the first wavelength by about 5 nm to about 50 nm. In some example embodiments, the third wavelength is in the same wavelength region as the first and second wavelengths. In some example embodiments, the third wavelength may be within a wavelength region of about 750 nm to about 1200 nm. In some example embodiments, the third wavelength may be within a wavelength region of about 750 nm to about 900 nm.

In some example embodiments, a reflection spectrum of the photoelectric diode 100 may be different from a reflection spectrum of the photoelectric conversion layer 30. The reflection spectrum of the photoelectric diode 100 may have a reflection peak at a fourth wavelength within a near infra-red wavelength region and the fourth wavelength may be different from the second wavelength that is a reflection peak wavelength of the aforementioned photoelectric conversion layer 30. Restated, the photoelectric diode 100 may be associated with a separate optical spectrum that has a reflection peak at a fourth wavelength. Accordingly, the photoelectric diode 100 may be associated with a separate optical spectrum that has a light-absorption peak at a third wavelength and a reflection peak at a fourth wavelength. A reflectance of the photoelectric diode 100 at the fourth wavelength may be lower than a reflectance of the photoelectric conversion layer 30 at the second wavelength. In some example embodiments, a reflectance of the photoelectric diode 100 at the fourth wavelength may be lower than a reflectance of the photoelectric conversion layer 30 at the second wavelength by about 5% to about 80%, about 5% to about 60%, or about 5% to about 50%.

In some example embodiments, an overlap between the light-absorption spectrum and the reflection spectrum of the photoelectric diode 100 may be less than an overlap between the light-absorption spectrum and the reflection spectrum of the photoelectric conversion layer 30. In some example embodiments, a difference between the third wavelength and the fourth wavelength in the optical spectrum of the photoelectric diode 100 may be larger than a difference between the first wavelength and the second wavelength in the optical spectrum of the photoelectric conversion layer 30. In some example embodiments, the difference between the third wavelength and the fourth wavelength in the optical spectrum of the photoelectric diode 100 may be greater than about 50 nm, in some example embodiments, greater than about 50 nm and less than or equal to about 200 nm.

Accordingly, a difference between absorptance and reflectance at the third wavelength that is a light-absorption peak wavelength of the photoelectric diode 100 may be larger than a difference between absorptance and reflectance at the first wavelength that is a light-absorption peak wavelength of the photoelectric conversion layer 30. Thus, even though the photoelectric conversion layer 30 includes a light-absorbing material exhibiting relatively high reflectance in a near infra-red wavelength region, it may be compensated by the compensation layer 40 to improve optical properties of the photoelectric diode 100 and thus the performance of the photoelectric diode 100, a sensor including the photoelectric diode 100, and/or an electronic device that includes the photoelectric diode 100.

The compensation layer 40 may include, in some example embodiments a charge transporting light-absorbing material, but is not limited thereto. In addition to the aforementioned compensation function, the charge transporting light-absorbing material may enhance a balance between holes and electrons by controlling hole mobility or electron mobility. In some example embodiments, the compensation layer 40 may be fullerene or a fullerene derivative, but is not limited thereto.

The compensation layer 40 may be thinner than the photoelectric conversion layer 30, in some example embodiments the thickness 40T of the compensation layer 40 may be less than or equal to about 100 nm, in some example embodiments about 5 nm to about 100 nm. In some example embodiments, a thickness ratio of the thickness 40T of the compensation layer 40 and the thickness 30T of the photoelectric conversion layer 30 may be about 1:1.5 to about 1:20, in some example embodiments about 1:1.5 to about 1:10, about 1:2 to about 1:9, or about 1:2.4 to about 1:8.

In some example embodiments, the photoelectric diode 100 shown in FIG. 1 may omit the compensation layer 40 as a separate layer, and the second electrode 20 may be configured to compensate light-absorption and reflection characteristics of the photoelectric diode 100 in one or more wavelength regions in addition to serving as an electrode. For example, in some example embodiments, the second electrode 20 may include any of the example embodiments of charge transporting light-absorbing materials as described herein. In some example embodiments, the second electrode 20 may include a charge transporting light-absorbing material and a material having a refractive index of about 1.5 to about 2.5.

Figure 2:
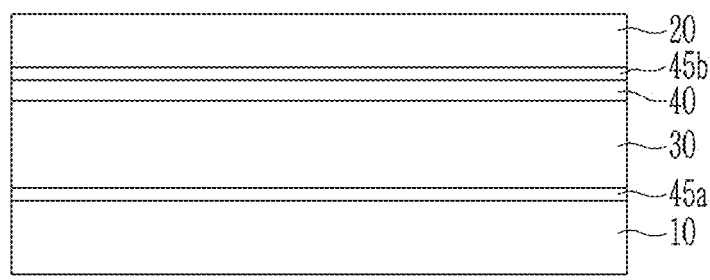
FIG. 2 is a cross-sectional view of a photoelectric diode according to some example embodiments.

FIG. 2 is a cross-sectional view of a photoelectric diode according to some example embodiments.

Referring to FIG. 2, the photoelectric diode 100 according to some example embodiments includes a first electrode 10, a second electrode 20, a photoelectric conversion layer 30, and a compensation layer 40, like some example embodiments as described with reference to FIG. 1.

However, the photoelectric diode 100 according to some example embodiments further includes charge auxiliary layers 45a and 45b between the first electrode 10 and the photoelectric conversion layer 30 and/or between the second electrode 20 and the photoelectric conversion layer 30. The charge auxiliary layers 45a and 45b may increase efficiency of the photoelectric diode 100, and thus the performance thereof, by facilitating the transfer of holes and electrons separated from the photoelectric conversion layer 30.

The charge auxiliary layers 45a and 45b may include at least one selected from a hole injection layer (HIL) for facilitating hole injection, a hole transport layer (HTL) for facilitating hole transport, an electron blocking layer (EBL) for preventing electron transport, an electron injection layer (EIL) for facilitating electron injection, an electron transport layer (ETL) for facilitating electron transport, and a hole blocking layer (HBL) for preventing hole transport.

The charge auxiliary layers 45a and 45b may include, in some example embodiments, an organic material, an inorganic material, or an organic/inorganic material. The organic material may be an organic material having hole or electron characteristics and the inorganic material may be, in some example embodiments, a metal oxide such as a molybdenum oxide, a tungsten oxide, or a nickel oxide.

One of the charge auxiliary layers 45a and 45b may be omitted.

In some example embodiments, the photoelectric diode 100 shown in FIG. 2 may omit the compensation layer 40 as a separate layer, and the second electrode 20 may be configured to compensate light-absorption and reflection characteristics of the photoelectric diode 100 in one or more wavelength regions in addition to serving as an electrode, as described above with reference to FIG. 1.

Figure 3:
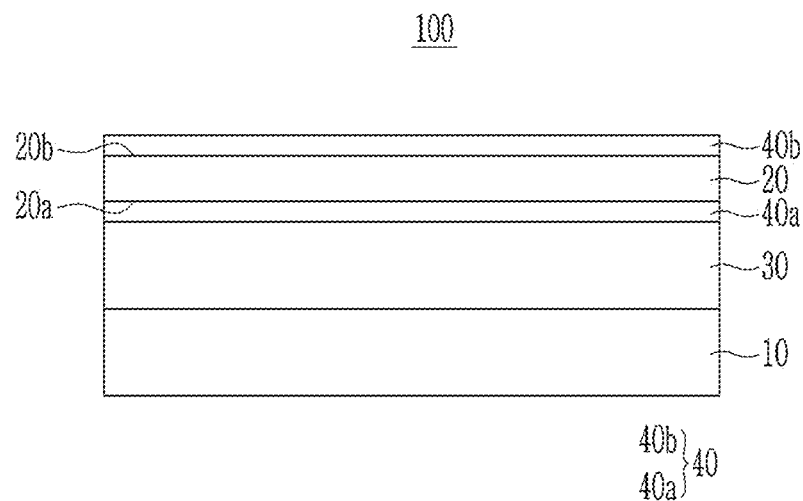
FIG. 3 is a cross-sectional view of a photoelectric diode according to some example embodiments.

FIG. 3 is a cross-sectional view of a photoelectric diode according to some example embodiments.

Referring to FIG. 3, a photoelectric diode 100 according to some example embodiments includes a first electrode 10, a second electrode 20, a photoelectric conversion layer 30, and a compensation layer 40 like some example embodiments as described with reference to FIG. 1.

However, the compensation layer 40 according to some example embodiments includes a first compensation layer 40a on the second electrode 20 (e.g., between the second electrode 20 and the photoelectric conversion layer 30) and a second compensation layer 40b on the second electrode 20 (e.g., distal from the photoelectric conversion layer 30 in relation to the second electrode). As shown in FIG. 3, the first compensation layer 40a may be on a first surface 20a of the second electrode 20, and the second electrode 40b may be on a second, opposite surface 20b of the second electrode 20. It will be understood that an element "on" another element may be above or under the other element, and an element that is "on" another element may be directly on the other element such that the elements are in direct contact with each other or the element may be indirectly on the other element such that the elements are isolated from direct contact with each other by one or more interposing structures and/or spaces.

The first compensation layer 40a and the second compensation layer 40b may be configured to compensate light-absorption and reflection characteristics of the photoelectric diode 100 in a near infra-red wavelength region as described above. In some example embodiments, the first compensation layer 40a may be the same as the compensation layer 40 of some example embodiments as described with reference to FIG. 1 and the second compensation layer 40b may further improve reflection characteristics of the photoelectric diode 100. In some example embodiments, the first compensation layer 40a may include the charge transporting light-absorbing material as described above and the second compensation layer 40b may include a high refractive material having a refractive index of about 1.5 to about 2.5.

In some example embodiments, the first compensation layer 40a may include a semiconductor material having hole or electron characteristics and the second compensation layer 40b may include, in some example embodiments a metal oxide such as an aluminum-containing oxide, a molybdenum-containing oxide, a tungsten-containing oxide, a vanadium-containing oxide, a rhenium-containing oxide, a niobium-containing oxide, a tantalum-containing oxide, a titanium-containing oxide, a nickel-containing oxide, a copper-containing oxide, a cobalt-containing oxide, a manganese-containing oxide, a chromium-containing oxide, a tellurium-containing oxide, or a combination thereof, but is not limited thereto. In some example embodiments, the first compensation layer 40a may include fullerene or a fullerene derivative and the second compensation layer 40b may include an aluminum-containing oxide such as $Al_2O_3$.

Figure 4:
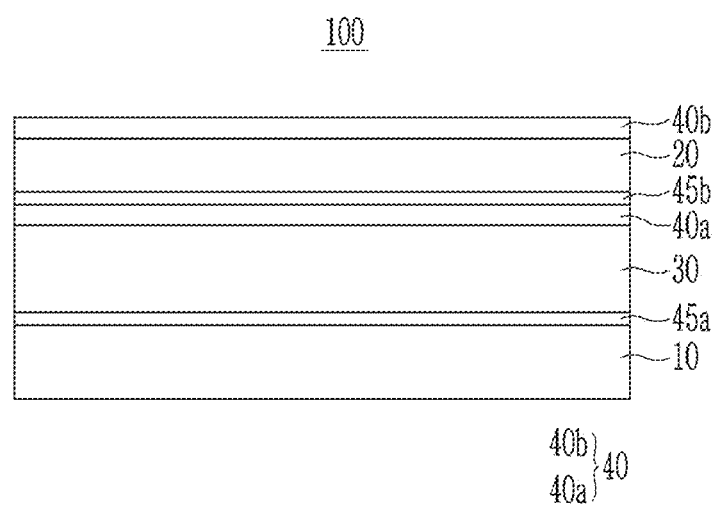
FIG. 4 is a cross-sectional view of a photoelectric diode according to some example embodiments.

FIG. 4 is a cross-sectional view of a photoelectric diode according to some example embodiments.

Referring to FIG. 4, the photoelectric diode 100 according to some example embodiments includes a first electrode 10, a second electrode 20, a photoelectric conversion layer 30, a first compensation layer 40a, and a second compensation layer 40b, like some example embodiments as described with reference to FIG. 3.

However, the photoelectric diode 100 according to some example embodiments further includes charge auxiliary layers 45a and 45b between the first electrode 10 and the photoelectric conversion layer 30 and/or between the second electrode 20 and the photoelectric conversion layer 30. The charge auxiliary layers 45a and 45b may increase efficiency by facilitating the transfer of holes and electrons separated from the photoelectric conversion layer 30, and details thereof are the same as described above.

One of the charge auxiliary layers 45a and 45b may be omitted.

Figure 5:
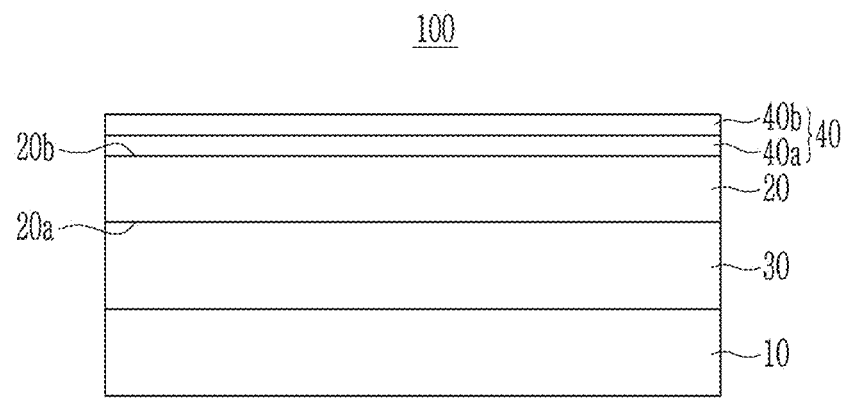
FIG. 5 is a cross-sectional view of a photoelectric diode according to some example embodiments.

FIG. 5 is a cross-sectional view of a photoelectric diode according to some example embodiments.

Referring to FIG. 5, the photoelectric diode 100 according to some example embodiments includes a first electrode 10, a second electrode 20, a photoelectric conversion layer 30, a first compensation layer 40a, and a second compensation layer 40b, like some example embodiments as described with reference to FIG. 3.

However, as shown in FIG. 5, the first compensation layer 40a and the second compensation layer 40b are disposed on a common surface 20b of the second electrode 20, such that both the first compensation layer 40a and the second compensation layer 40b are distal from the photoelectric conversion layer 30 in relation to the second electrode 20 and where the first compensation layer 40a is between the second electrode 20 and the second compensation layer 40b or the second compensation layer 40b is between the second electrode 20 and the first compensation layer 40a.

The first compensation layer 40a and the second compensation layer 40b may be configured to compensate light-absorption and reflection characteristics of the photoelectric diode 100 in a near infra-red wavelength region as described above. In some example embodiments, the first compensation layer 40a may include charge transporting light-absorbing material having light absorption characteristics and the second compensation layer 40b may include a high refractive material having a refractive index of about 1.5 to about 2.5. In some example embodiments, the first compensation layer 40a may include a semiconductor material having hole or electron characteristics and the second compensation layer 40b may include, in some example embodiments a metal oxide such as an aluminum-containing oxide, a molybdenum-containing oxide, a tungsten-containing oxide, a vanadium-containing oxide, a rhenium-containing oxide, a niobium-containing oxide, a tantalum-containing oxide, a titanium-containing oxide, a nickel-containing oxide, a copper-containing oxide, a cobalt-containing oxide, a manganese-containing oxide, a chromium-containing oxide, a tellurium-containing oxide, or a combination thereof, but is not limited thereto. In some example embodiments, the first compensation layer 40a may include fullerene or a fullerene derivative and the second compensation layer 40b may include an aluminum-containing oxide such as $Al_2O_3$.

Figure 6:
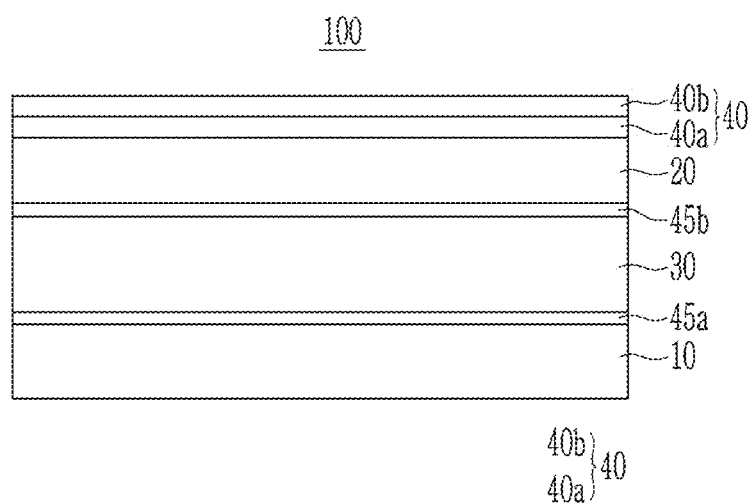
FIG. 6 is a cross-sectional view of a photoelectric diode according to some example embodiments.

FIG. 6 is a cross-sectional view of a photoelectric diode according to some example embodiments.

Referring to FIG. 6, the photoelectric diode 100 according to some example embodiments includes a first electrode 10, a second electrode 20, a photoelectric conversion layer 30, a first compensation layer 40a, and a second compensation layer 40b, like some example embodiments as described with reference to FIG. 5.

However, the photoelectric diode 100 according to some example embodiments further includes charge auxiliary layers 45a and 45b disposed between the first electrode 10 and the photoelectric conversion layer 30 and/or between the second electrode 20 and the photoelectric conversion layer 30. The charge auxiliary layers 45a and 45b may increase efficiency by facilitating the transfer of holes and electrons separated from the photoelectric conversion layer 30 and details thereof are the same as described above.

One of the charge auxiliary layers 45a and 45b may be omitted.

The photoelectric diode 100 may be applied to a solar cell, an image sensor, a photodetector, and a photo-sensor, but is not limited thereto.

The photoelectric diode may be in some example embodiments applied to an organic sensor. The organic sensor may be an organic CMOS sensor, in some example embodiments an organic CMOS infrared light sensor or an organic CMOS image sensor.

Figure 7:
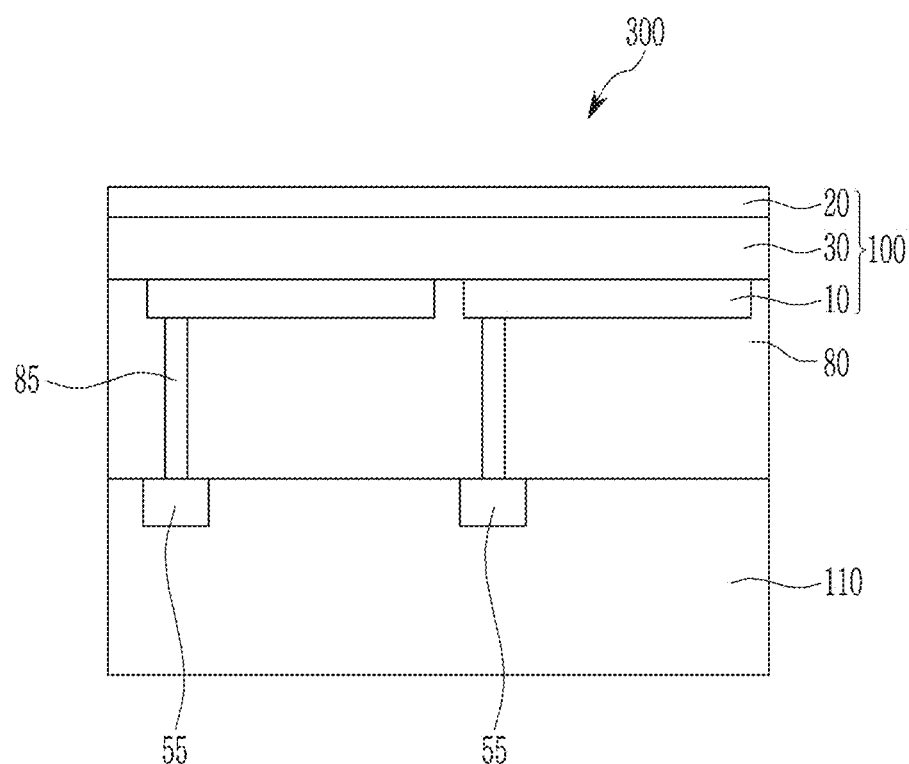
FIG. 7 is a cross-sectional view of an organic sensor according to some example embodiments.

FIG. 7 is a cross-sectional view of an organic sensor according to some example embodiments.

The organic sensor 300 according to some example embodiments includes a semiconductor substrate 110, an insulation layer 80, and a photoelectric diode 100.

The semiconductor substrate 110 may be a silicon substrate and is integrated with a transmission transistor (not shown) and a charge storage 55. The charge storage 55 may be integrated in each pixel. The charge storage 55 is electrically connected to the photoelectric diode 100 that will be described later and information of the charge storage 55 may be transferred by the transmission transistor.

A metal wire (not shown) and a pad (not shown) are formed on the semiconductor substrate 110. In order to decrease signal delay, the metal wire and pad may be made of a metal having low resistivity, in some example embodiments, aluminum (Al), copper (Cu), silver (Ag), and alloys thereof, but are not limited thereto. Further, it is not limited to the structure, and the metal wire and pad may be disposed under the semiconductor substrate 110.

The insulation layer 80 is formed on the metal line and pad. The insulation layer 80 may be made of an inorganic insulating material such as a silicon oxide and/or a silicon nitride, or a low dielectric constant (low K) material such as SiC, SiCOH, SiCO, and SiOF. The insulation layer 60 has a trench 85 exposing the charge storage 55. The trench 85 may be filled with fillers.

The aforementioned photoelectric diode 100 is formed on the insulation layer 80. As described above, the photoelectric diode 100 includes a first electrode 10, a second electrode 20, a photoelectric conversion layer 30, and a compensation layer 40.

The first electrode 10 and the second electrode 20 may both be transparent electrodes, and the photoelectric conversion layer 30 and the compensation layer 40 are the same as described above. The photoelectric conversion layer 30 may be configured to selectively absorb light in a near infra-red wavelength region. The light incident from the second electrode 20 side may have good optical properties including high light-absorption characteristics and low reflection characteristics in the near infra-red wavelength region by a combination of the photoelectric conversion layer 30 and the compensation layer 40, and thus may exhibit good photoelectric conversion characteristics.

FIG. 7 illustrates some example embodiments including the photoelectric diode of FIG. 1, but the disclosure is not limited thereto, a photoelectric diode of FIGS. 2 to 6 may be included.

Focusing lens (not shown) may be further formed on the photoelectric diode 100. The focusing lens may control a direction of incident light and gather the light in one region. The focusing lens may have a shape of, in some example embodiments, a cylinder or a hemisphere, but is not limited thereto.

The organic sensor according to some example embodiments may be an organic infrared light sensor, in some example embodiments an iris sensor or a depth sensor.

The iris sensor may identify a person by using unique iris characteristics of every person and specifically, taking an image of an eye of a user within an appropriate distance, processing the image, and comparing it with his/her stored image.

The depth sensor may identify a shape and a location of an object from its three-dimensional information by taking an image of the object within an appropriate distance with a user and processing the image. This depth sensor may be in some example embodiments used as a face recognition sensor.

Figure 8:
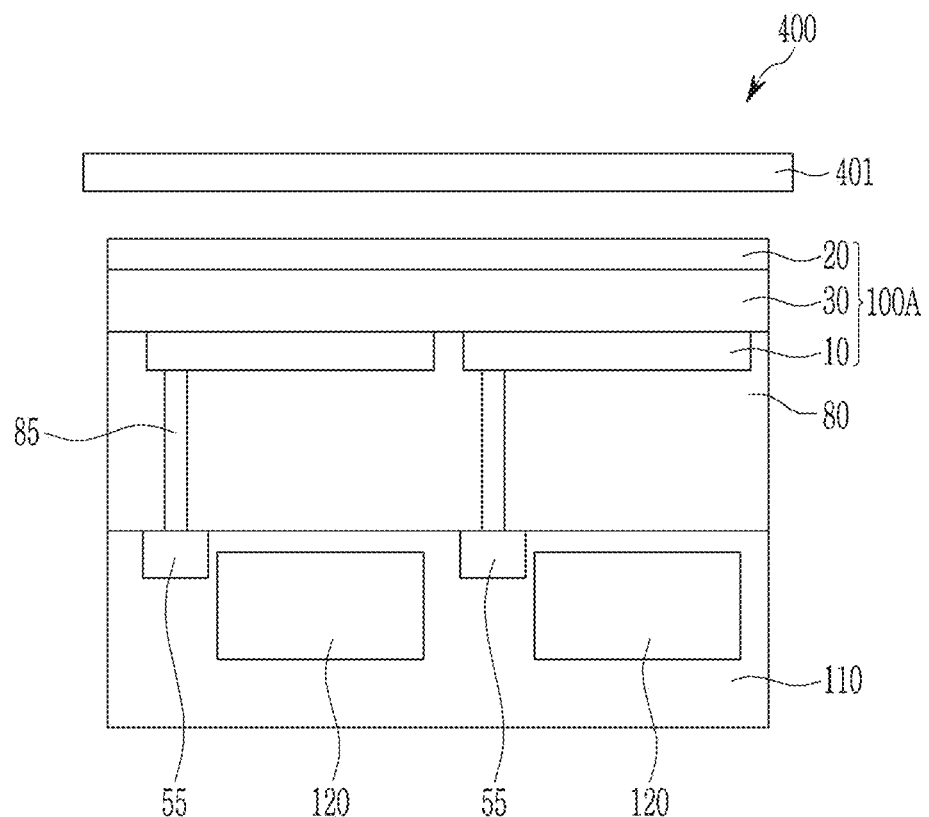
FIG. 8 is a cross-sectional view of an organic sensor according to some example embodiments.

FIG. 8 is a cross-sectional view of an organic sensor according to some example embodiments.

The organic sensor according to some example embodiments may include a plurality of sensors having different functions. In some example embodiments, at least one sensor of the plurality of sensors having different functions may be a biometric sensor, and the biometric sensor may be in some example embodiments an iris sensor, a depth sensor, a fingerprint sensor, a blood vessel distribution sensor, and the like, but is not limited thereto. In some example embodiments, one of the plurality of sensors having different functions may be an iris sensor and the other may be a depth sensor.

In some example embodiments, a plurality of sensors may include, in some example embodiments a first infrared light sensor configured to sense light in an infrared region having a first wavelength ($\lambda_1$) in a near infra-red wavelength region and a second infrared light sensor configured to sense light in an infrared region having a second wavelength ($\lambda_2$) in a near infra-red wavelength region.

The first wavelength ($\lambda_1$) and the second wavelength ($\lambda_2$) may be in some example embodiments different in a wavelength region of about 750 nm to about 3000 nm, and in some example embodiments a difference between the first wavelength ($\lambda_1$) and the second wavelength ($\lambda_2$) may be greater than or equal to about 30 nm, greater than or equal to about 50 nm, greater than or equal to about 70 nm, greater than or equal to about 80 nm, or greater than or equal to about 90 nm.

In some example embodiments, one of the first wavelength ($\lambda_1$) and the second wavelength ($\lambda_2$) may belong to a wavelength region of about 750 nm to about 900 nm and the other of the first wavelength ($\lambda_1$) and the second wavelength ($\lambda_2$) may belong to a wavelength region of about 800 nm to about 1000 nm.

In some example embodiments, one of the first wavelength ($\lambda_1$) and the second wavelength ($\lambda_2$) may belong to a wavelength region of about 780 nm to about 840 nm and the other of the first wavelength ($\lambda_1$) and the second wavelength ($\lambda_2$) may belong to a wavelength region of about 910 nm to about 970 nm.

In some example embodiments, one of the first wavelength ($\lambda_1$) and the second wavelength ($\lambda_2$) may belong to a wavelength region of about 800 nm to about 830 nm and the other of the first wavelength ($\lambda_1$) and the second wavelength ($\lambda_2$) may belong to a wavelength region of about 930 nm to about 950 nm.

In some example embodiments, one of the first wavelength ($\lambda_1$) and the second wavelength ($\lambda_2$) may belong to a wavelength region of about 805 nm to about 815 nm and the other of the first wavelength ($\lambda_1$) and the second wavelength ($\lambda_2$) may belong to a wavelength region of about 935 nm to about 945 nm.

In some example embodiments, one of the first wavelength ($\lambda_1$) and the second wavelength ($\lambda_2$) may about 810 nm and the other of the first wavelength ($\lambda_1$) and the second wavelength ($\lambda_2$) may be about 940 nm.

The organic sensor 400 according to some example embodiments includes a dual bandpass filter 401, a first infrared light sensor 100A, an insulation layer 80, and a semiconductor substrate 110 integrated with a second infrared light sensor 120. The first infrared light sensor 100A and the second infrared light sensor 120 may be stacked.

The dual bandpass filter 401 may be disposed on a front side of the organic sensor 400 and may be configured to selectively transmit infrared light including the first wavelength ($\lambda_1$) and infrared light including the second wavelength ($\lambda_2$) and may be configured to block and/or absorb light except for infrared light. Herein, light except for infrared light may include light in an ultraviolet (UV) and visible region.

The first infrared light sensor 100A may be the photoelectric diode 100 according to some example embodiments and details thereof are omitted. FIG. 5 illustrates some example embodiments including the photoelectric diode of FIG. 1, but the disclosure is not limited thereto, a photoelectric diode of FIG. 2 or 3 may be included.

The second infrared light sensor 120 may be integrated in the semiconductor substrate 110 and may be a photo-sensing device. The semiconductor substrate 110 may be in some example embodiments a silicon substrate and may be integrated with the second infrared light sensor 120, the charge storage 55, and a transmission transistor (not shown).

The second infrared light sensor 120 may be a photodiode and may be configured to sense entered light, and sensed information may be transferred by the transmission transistor. Herein, the light entered into the second infrared light sensor 120 is light that passes the dual bandpass filter 401 and the first infrared light sensor 100A and may be infrared light in a predetermined region including the second wavelength ($\lambda_2$). All infrared light in a predetermined region including the first wavelength ($\lambda_1$) may be absorbed by the photoelectric conversion layer 30 and may not reach the second infrared light sensor 120. In this case, a separate filter for wavelength selectivity with respect to the light entered into the second infrared light sensor 120 is not separately needed. However, for the time when all infrared light in a predetermined region including the first wavelength ($\lambda_1$) is not absorbed by the photoelectric conversion layer 30, a filter between the first infrared light sensor 100A and the second infrared light sensor 120 may be further disposed.

The organic sensor according to some example embodiments may include two infrared light sensors respectively performing separately functions and thus may work as a combination sensor. In addition, two sensors performing separately functions are stacked in each pixel, and thus the number of pixel performing functioning of each sensor is twice increased while maintaining a size and resultantly, sensitivity may be much improved.

Figure 9:
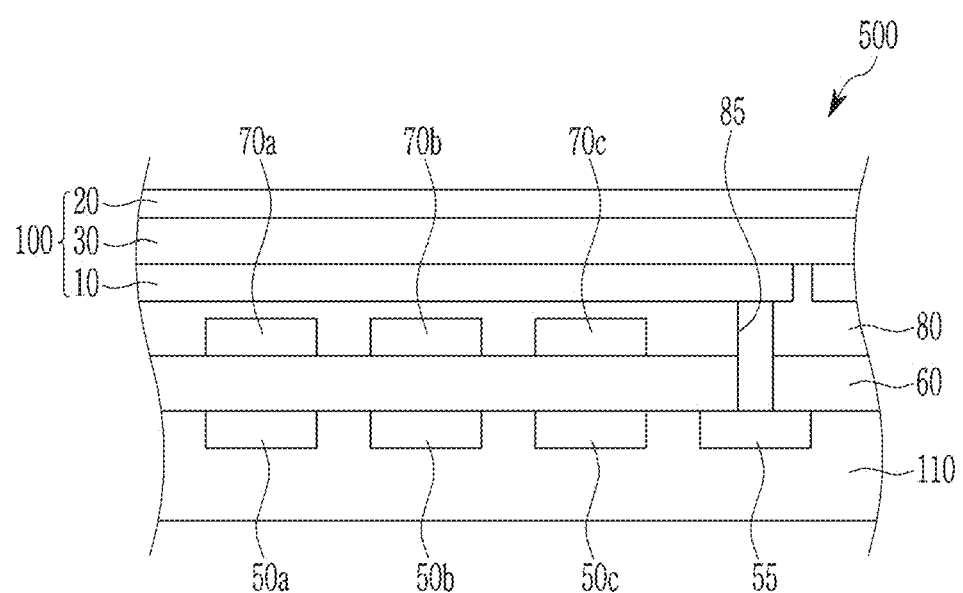
FIG. 9 is a cross-sectional view of an organic sensor according to some example embodiments.
Figure 10:
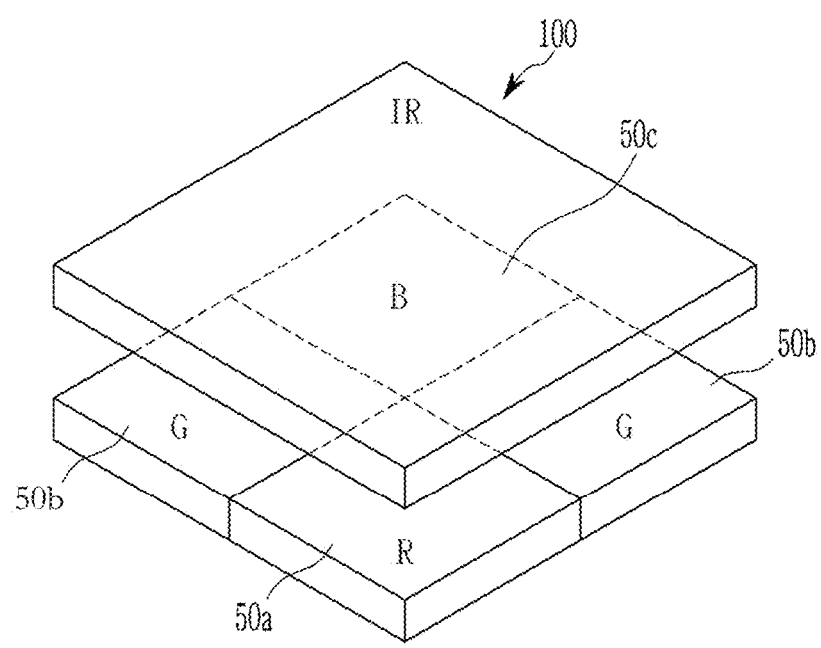
FIG. 10 is a perspective view of the organic sensor of FIG. 9 according to some example embodiments.

FIG. 9 is a cross-sectional view of an organic sensor according to some example embodiments. FIG. 10 is a perspective view of the organic sensor of FIG. 9 according to some example embodiments.

An organic sensor according to some example embodiments may be an organic CMOS image sensor.

Referring to FIG. 9, an organic sensor 500 according to some example embodiments includes a semiconductor substrate 110 integrated with photo-sensing devices 50a, 50b, and 50c, a transmission transistor (not shown), and a charge storage 55; a lower insulation layer 60; color filters 70a, 70b, and 70c; an upper insulation layer 80; and a photoelectric diode 100.

The semiconductor substrate 110 may be integrated with photo-sensing devices 50a, 50b, and 50c, a transmission transistor (not shown), and a charge storage 55. The photo-sensing devices 50a, 50b, and 50c may be photodiodes.

The photo-sensing devices 50a, 50b, and 50c, the transmission transistor, and/or the charge storage 55 may be integrated in each pixel. In some example embodiments, the photo-sensing device 50a may be included in a red pixel, the photo-sensing device 50b may be included in a green pixel, and the photo-sensing device 50c may be included in a blue pixel.

The photo-sensing devices 50a, 50b, and 50c may be configured to sense light, the information sensed by the photo-sensing devices may be transferred by the transmission transistor, the charge storage 55 is electrically connected to the photoelectric diode 100 that will be described later, and the information of the charge storage 55 may be transferred by the transmission transistor.

A metal wire (not shown) and a pad (not shown) are formed on the semiconductor substrate 110. In order to decrease signal delay, the metal wire and pad may be made of a metal having low resistivity, in some example embodiments, aluminum (Al), copper (Cu), silver (Ag), and alloys thereof, but are not limited thereto. Further, it is not limited to the structure, and the metal wire and pad may be disposed under the photo-sensing devices 50*a* and 50*b*.

The lower insulation layer 60 is formed on the metal wire and the pad.

Color filters 70*a*, 70*b*, and 70*c* are formed on the lower insulation layer 60. The color filters 70*a*, 70*b*, and 70*c* includes a red filter 70*a* formed in a red pixel, a green filter 70*b* formed in a green pixel, and a blue filter 70*c* formed in a blue pixel.

The upper insulation layer 80 is formed on the color filters 70*a*, 70*b*, and 70*c*. The upper insulation layer 80 may eliminate steps caused by the color filters 70*a*, 70*b*, and 70*c* and may planarize the surface.

The photoelectric diode 100 is formed on the upper insulation layer 80. As described above, the photoelectric diode 100 includes a first electrode 10, a photoelectric conversion layer 30, and a second electrode 20. Even though a structure in which the first electrode 10, the photoelectric conversion layer 30 and the second electrode 20 are sequentially stacked is shown as an example in the drawing, the present disclosure is not limited to this structure, and the second electrode 20, the photoelectric conversion layer 30, and the first electrode 10 may be arranged in this order.

The first electrode 10 and the second electrode 20 may both be transparent electrodes, and the photoelectric conversion layer 30 and the compensation layer 40 are the same as described above. The photoelectric conversion layer 30 may be configured to absorb light in a near infra-red wavelength region to photoelectrically convert it.

Incident light from the side of the second electrode 20 may be photoelectrically converted by mainly absorbing light in a near infra-red wavelength region in the photoelectric conversion layer 30. Light in the remaining wavelength region may pass through the first electrode 10 and the color filters 70*a*, 70*b*, and 70*c*, the light in a red wavelength region passing through the color filter 70*a* may be sensed by the photo-sensing device 50*a*, the light in a green wavelength region passing through the color filter 70*b* may be sensed by the photo-sensing device 50*b*, and the light in a blue wavelength region passing through the color filter 70*c* may be sensed by the photo-sensing device 50*c*.

The aforementioned organic sensor may be applied to various electronic devices, in some example embodiments and the electronic devices may include in some example embodiments a camera, a camcorder, a mobile phone internally having them, a display device, a security device, or a medical device, but are not limited thereto.

Figure 11:
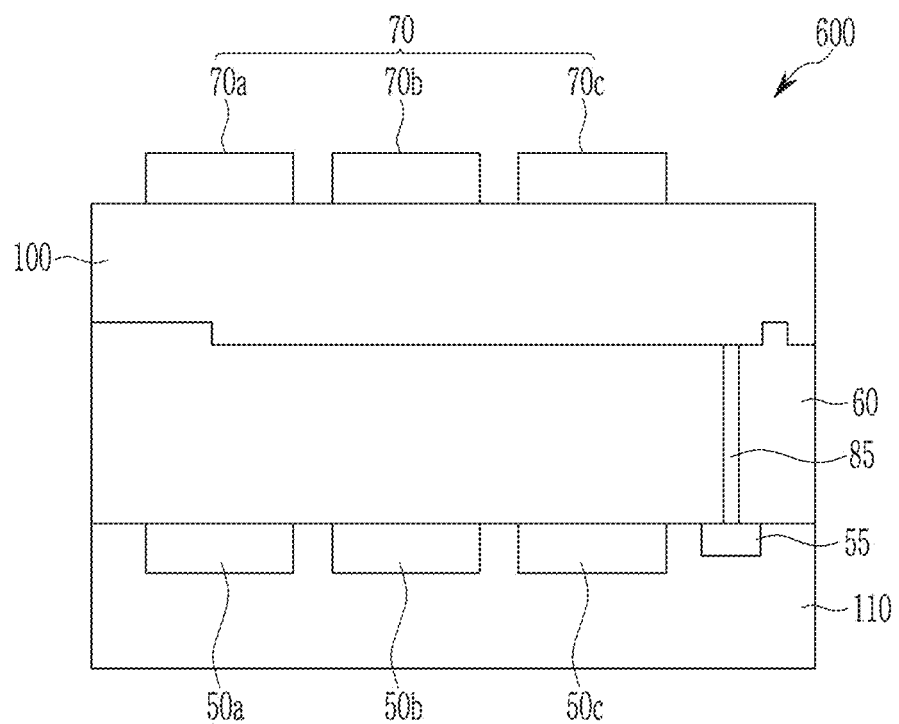
FIG. 11 is a schematic cross-sectional view of an organic sensor according to some example embodiments.

FIG. 11 is a schematic cross-sectional view of an organic sensor according to some example embodiments.

Referring to FIG. 11, an organic sensor 600 according to some example embodiments includes a semiconductor substrate 110 integrated with photo-sensing devices 50*a*, 50*b*, and 50*c*, a transmission transistor (not shown) and a charge storage 55, a lower insulation layer 60, a color filter layer 70 including color filters 70*a*, 70*b*, and 70*c*, and a photoelectric diode 100. The photoelectric diode 100 shown in FIG. 11 may be any of the example embodiments of photoelectric diode 100 described herein with regard to FIGS. 1-6.

As shown in FIG. 11, the photoelectric diode 100 may be between the semiconductor substrate 110 and the color filter layer 70, such that the color filter layer 70 is distal from the photo-sensing devices 50*a*, 50*b*, and 50*c* in relation to the photoelectric diode 100. Other structures are the same as the organic sensor of FIG. 9. In some example embodiments, the color filter layer 70 may include color filters configured to filter a mixture of wavelength spectra of light (e.g., mixed colors). For example, in FIG. 11, color filter 70*a* may be configured to filter magenta light, color filter 70*b* may be configured to filter cyan light, and color filter 70*b* may be configured to filter yellow light, while photo-sensing device 50*a* may be configured to detect ("sense") blue light and photo-sensing device 50*b* may be configured to detect red light.

Figure 12:
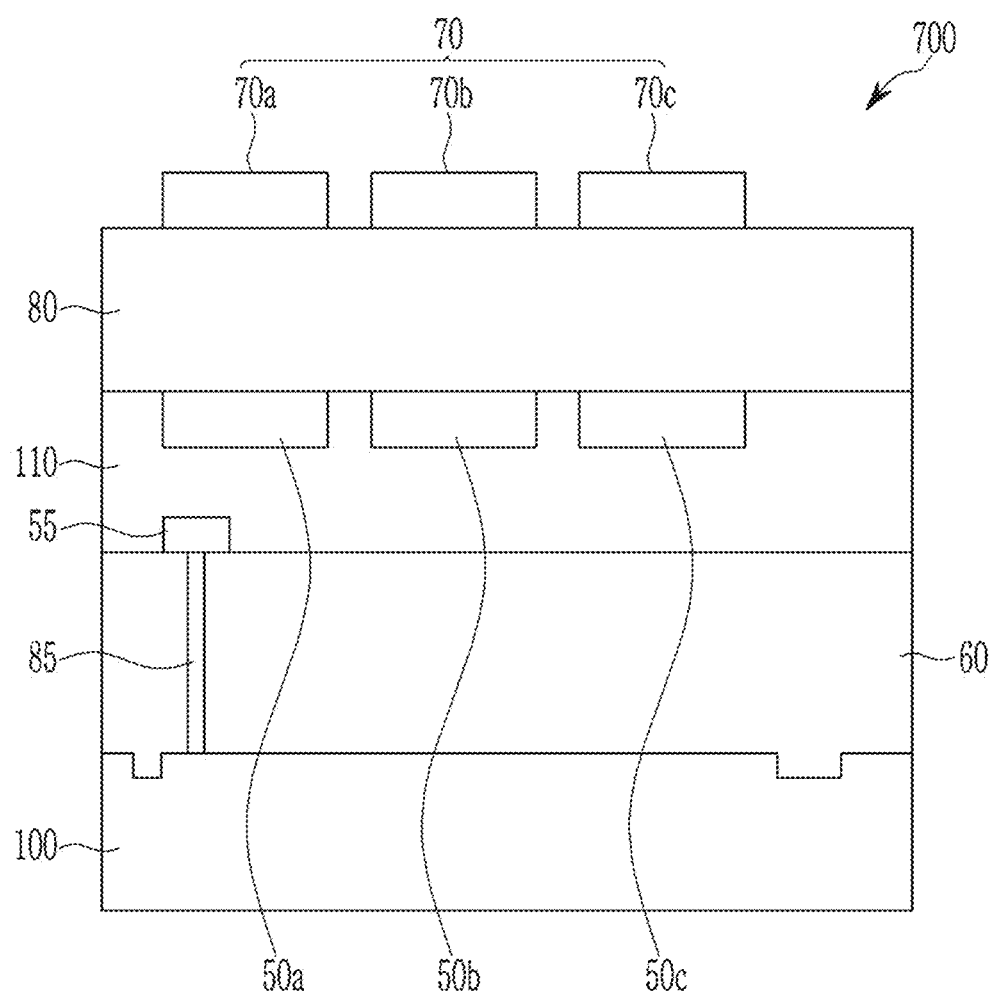
FIG. 12 is a schematic cross-sectional view of an organic sensor according to some example embodiments.

FIG. 12 is a schematic cross-sectional view of an organic sensor according to some example embodiments.

Referring to FIG. 12, an organic sensor 700 according to some example embodiments includes a semiconductor substrate 110 integrated with photo-sensing devices 50*a*, 50*b*, and 50*c*, a transmission transistor (not shown) and a charge storage 55, a lower insulation layer 60, a color filter layer 70, and an upper insulation layer 80 on the semiconductor substrate 110, and a photoelectric diode 100 under the semiconductor substrate 110. The photoelectric diode 100 shown in FIG. 12 may be any of the example embodiments of photoelectric diode 100 described herein with regard to FIGS. 1-6.

As shown in FIG. 12, the photoelectric diode 100 may be on (e.g., above or beneath) the semiconductor substrate 110, such that the color filter layer 70 is distal from the photoelectric diode 100 in relation to the photo-sensing devices 50*a*, 50*b*, and 50*c*. Other structures are the same as the organic sensor of FIG. 9.

Figure 13:
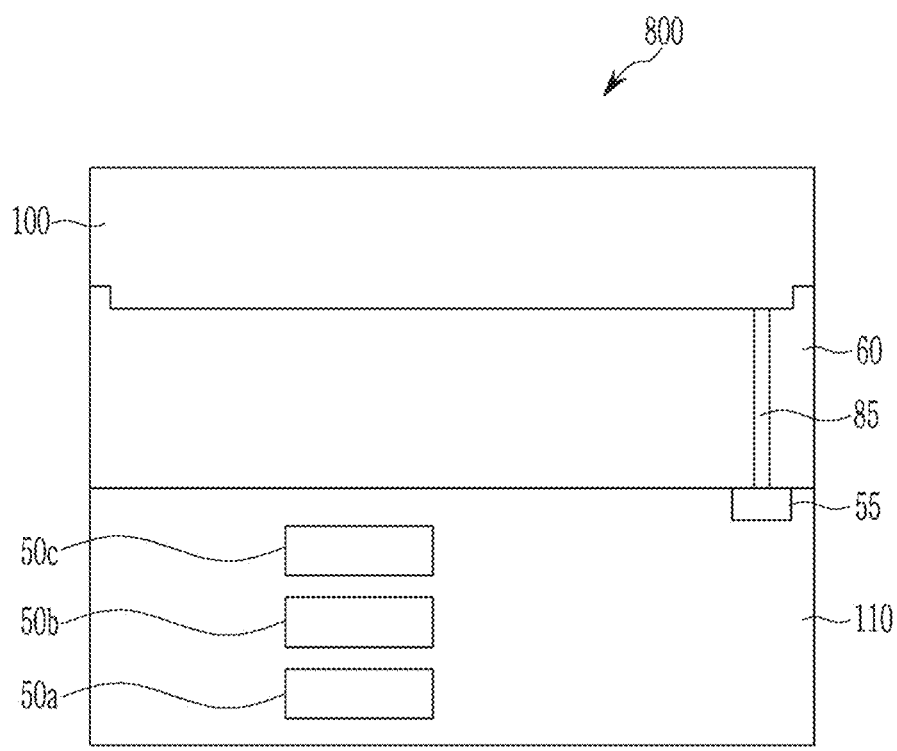
FIG. 13 is a cross-sectional view showing an organic sensor according to some example embodiments.

FIG. 13 is a cross-sectional view showing an organic sensor according to some example embodiments.

An organic sensor 800 according to some example embodiments includes a semiconductor substrate 110 integrated with photo-sensing devices 50*a*, 50*b*, and 50*c*, a transmission transistor (not shown), and a charge storage 55, an insulation layer 60 having a trench 85, and a photoelectric diode 100. The photoelectric diode 100 shown in FIG. 13 may be any of the example embodiments of photoelectric diode 100 described herein with regard to FIGS. 1-6.

In the organic sensor 800 according to some example embodiments, the photo-sensing devices 50*a*, 50*b*, and 50*c* are stacked in a vertical direction and the color filter layer 70 is omitted. The photo-sensing devices 50*a*, 50*b*, and 50*c* are electrically connected to charge storage (not shown) and may be transferred by the transmission transistor. The photo-sensing devices 50*a*, 50*b*, and 50*c* may selectively absorb light in separate, respective wavelength spectra of light depending on a stack depth of the respective photo-sensing devices 50*a*, 50*b*, and 50*c*. Other structures are the same as the organic sensor of FIG. 9.

Figure 14:
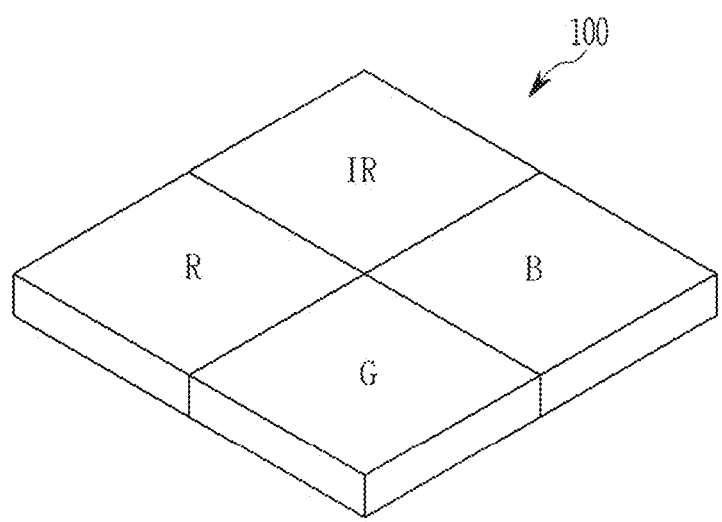
FIG. 14 is a perspective view of an organic sensor according to some example embodiments.
Figure 15:
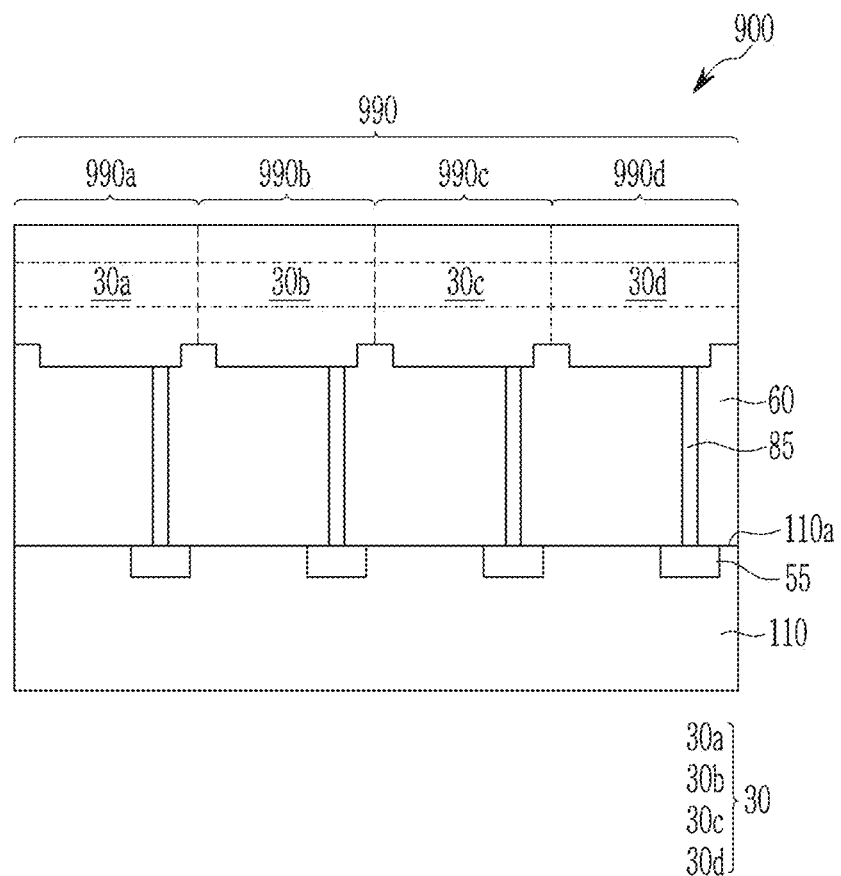
FIG. 15 is a schematic cross-sectional view showing the organic sensor of FIG. 14 according to some example embodiments.

FIG. 14 is a perspective view of an organic sensor according to some example embodiments. FIG. 15 is a schematic cross-sectional view showing the organic sensor of FIG. 14, according to some example embodiments.

As shown with reference to FIG. 15, an organic sensor 900 may include a photoelectric diode 990 that includes a plurality of photoelectric diodes 990*a*, 990*b*, 990*c*, and 990*d* on a semiconductor substrate 110, where the plurality of photoelectric diodes 990*a*, 990*b*, 990*c*, and 990*d* are configured to absorb and convert different ones of blue light, green light, red light, or infrared light (i.e., different wavelength spectra of incident light) into electric signals, respectively.

Referring to FIG. 15, an organic sensor 900 according to some example embodiments includes a semiconductor substrate 110 integrated with charge storages 55, transmission transistors (not shown), an insulation layer 60, and photoelectric diodes 990a, 990b, 990c, and 990d.

As shown with reference to FIGS. 14-15, an organic sensor 900 may include a photoelectric diode 990 that itself includes a plurality of photoelectric diodes 990a, 990b, 990c, and 990d on a semiconductor substrate 110, where the plurality of photoelectric diodes 990a, 990b, 990c, and 990d are configured to absorb and convert different ones of blue light, green light, red light, or infrared light (i.e., different wavelength spectra of incident light) into electric signals, respectively. As shown in FIG. 15, the separate photoelectric diodes 990a, 990b, 990c, and 990d may be horizontally arranged on the semiconductor substrate 110 such that the photoelectric diodes 990a, 990b, 990c, and 990d are partially or entirely overlapped with each other in a direction that extends in parallel with a top surface 110a of the semiconductor substrate 110. As shown, each separate photoelectric diode 990a, 990b, 990c, and 990d is connected to a separate charge storage 55 that is integrated into the semiconductor substrate 110 via a separate trench 85.

Each photoelectric diode 990a, 990b, 990c, and 990d may be any one of the photoelectric diodes described herein with reference to FIGS. 1-6. In some example embodiments, separate photoelectric diodes 990a, 990b, 990c, and 990d may include different portions of a common, continuous layer that extends continuously between two or more of the photoelectric diodes 990a, 990b, 990c, and 990d. In some example embodiments, the photoelectric diodes 990a, 990b, 990c, and 990d may share a common second electrode 20. In another example, two or more of the photoelectric diodes 990a, 990b, 990c, and 990d may have different photoelectric conversion layers 30a, 30b, 30c, and 30d that are configured to absorb different wavelength spectra of incident light. Other structures are the same as the organic sensor of FIG. 9.

Figure 16:
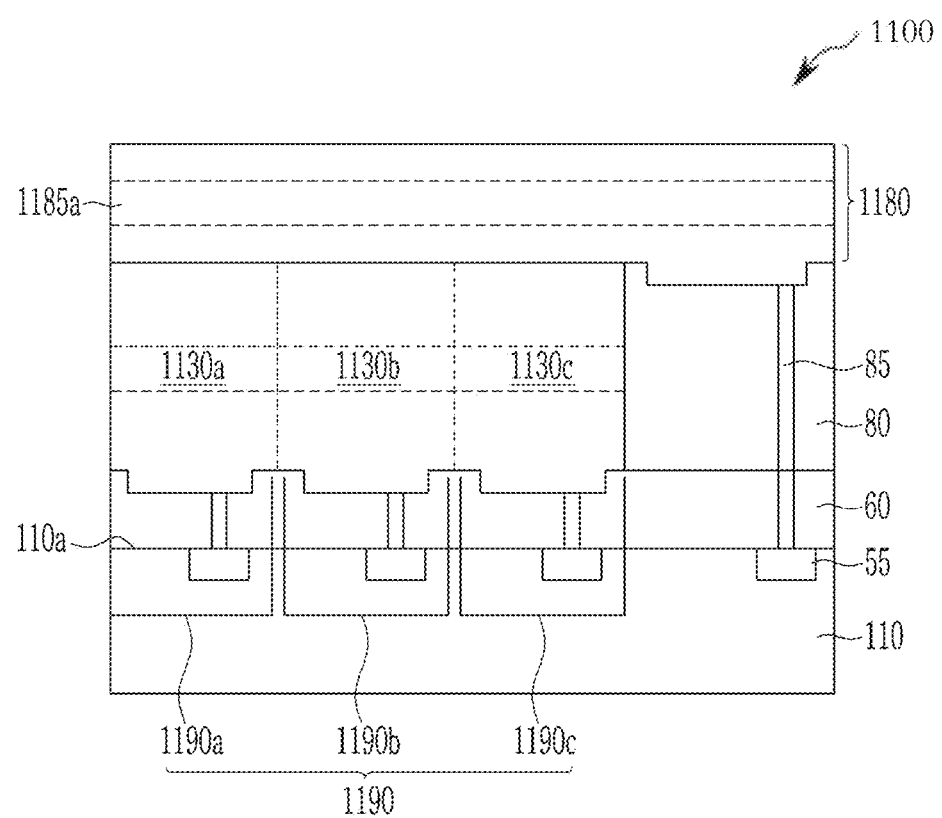
FIG. 16 is a schematic cross-sectional view of an organic sensor according to some example embodiments.

FIG. 16 is a schematic cross-sectional view of an organic sensor according to some example embodiments.

Referring to FIG. 16, an organic sensor 1100 includes a semiconductor substrate 110 integrated with charge storages, transmission transistors (not shown), an insulation layer 60, a first photoelectric diode 1180, and a separate photoelectric diode 1190 that includes a second photoelectric diode 1190a, a third photoelectric diode 1190b, and a fourth photoelectric diode 1190c. The first photoelectric diode 1180, which may be an infrared/near infrared photoelectric diode and thus may include a photoelectric conversion layer 1185a that is configured to absorb infrared and/or near infrared light, is formed on an entire surface of the separate photoelectric diode 1190. The second to fourth photoelectric diodes 1190a, 1190b, and 1190c of the separate photoelectric diode 1190 may be configured to absorb and convert different ones of blue light, green light, and red light (i.e., different wavelength spectra of incident light), respectively. For example, as shown, the second to fourth photoelectric diodes 1190a, 1190b, and 1190c may share a continuous opposed electrode and may include separate, respective pixel electrodes and may further each include separate, respective photoelectric conversion layers 1130a, 1130b, and 1130c that may be configured to absorb and convert separate, respective wavelength spectra of light (e.g., red light, green light, and blue light, respectively). Other structures are the same as the image sensor of FIG. 9.

Referring to FIG. 16, the first photoelectric diode 1180 may be stacked on the separate photoelectric diode 1190 so as to at least partially overlap in a direction extending perpendicular to the top surface 110a of the semiconductor substrate 110, and wherein the second to fourth photoelectric diodes 1190a to 1190c overlap in a direction extending parallel to the top surface 110a of the semiconductor substrate 110. It will be understood that, in some example embodiments, the second to fourth photoelectric diodes 1190a to 1190c include multiple, horizontally-arranged photoelectric diodes configured to absorb different wavelengths spectra of light while the first photoelectric diode 1180 is limited to a single photoelectric diode that is configured to absorb a single wavelength spectrum of light. In some example embodiments, including the example embodiments shown in FIG. 16, an entirety of the first photoelectric diode 1180 overlaps a limited portion of the second to fourth photoelectric diodes 1190a to 1190c in the direction extending perpendicular to the top surface 110a and a remainder portion of the first photoelectric diode 1180 that is exposed by the second to fourth photoelectric diodes 1190a to 1190c is covered by insulation layer 80. However, it will be understood that in some example embodiments an entirety of the first photoelectric diode 1180 overlaps a limited portion of the second to fourth photoelectric diodes 1190a to 1190c in the direction extending perpendicular to the top surface 110a. Each photoelectric diode of the organic sensor 1100 may be any one of the photoelectric diodes described herein with reference to FIGS. 1-6.

Figure 17:
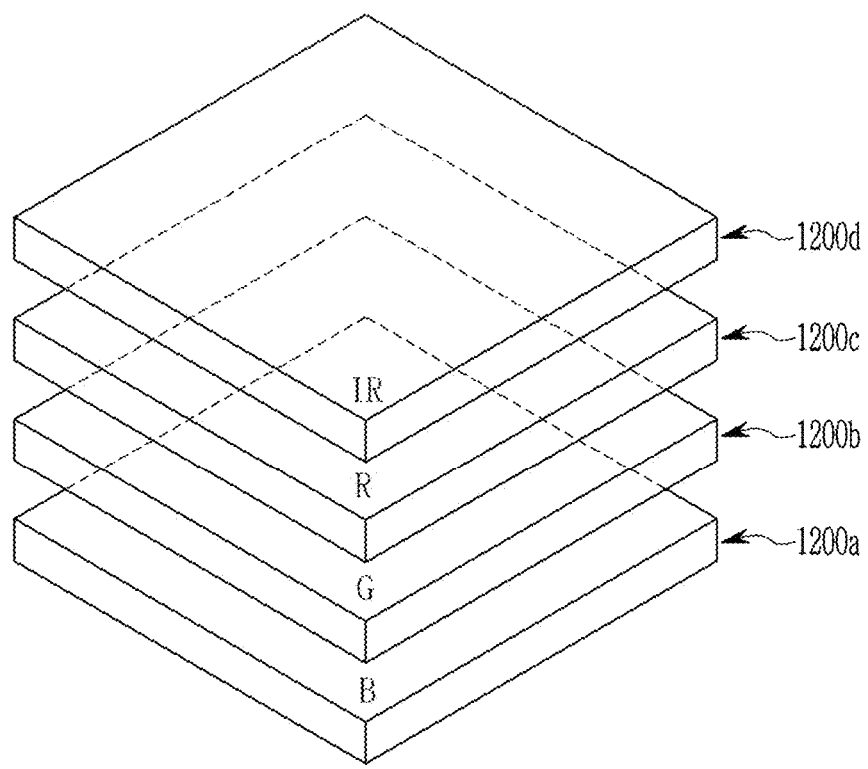
FIG. 17 is a perspective view of an organic sensor according to some example embodiments.
Figure 18:
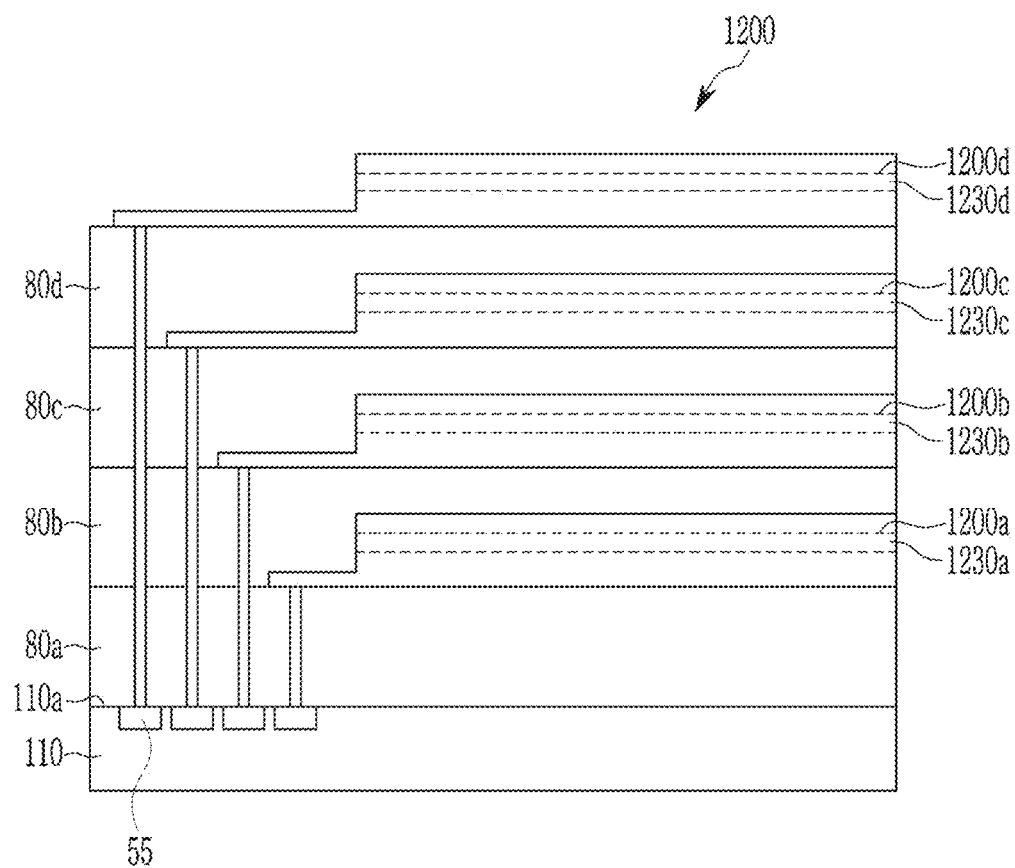
FIG. 18 is a schematic cross-sectional view showing the organic sensor of FIG. 17 according to some example embodiments.

FIG. 17 is a perspective view of an organic sensor according to some example embodiments, and FIG. 18 is a schematic cross-sectional view showing the organic sensor of FIG. 17 according to some example embodiments.

The organic sensor 1200 according to some example embodiments includes an infrared/near infrared photoelectric diode configured to selectively absorb light in an infrared/near infrared wavelength spectrum of light, a red photoelectric diode configured to selectively absorb and convert (into electric signals) light in a red wavelength spectrum of incident light, a green photoelectric diode configured to selectively absorb and convert (into electric signals) light in a green wavelength spectrum of incident light, a blue photoelectric diode configured to selectively absorb and convert (into electric signals) light in a blue wavelength spectrum of incident light, and they are stacked.

The organic sensor 1200 according to some example embodiments includes a semiconductor substrate 110, a lower insulation layer 80a, an intermediate insulation layer 80b, another intermediate insulation layer 80c, an upper insulation layer 80d, a first photoelectric diode 1200a, a second photoelectric diode 1200b, a third photoelectric diode 1200c, and a fourth photoelectric diode 1200d. As shown, the first to fourth photoelectric diode 1200a to 1200d are stacked vertically on the semiconductor substrate 110, such that the first to fourth photoelectric diode 1200a to 1200d overlap each other in a direction extending perpendicular to a top surface 110a of the semiconductor substrate 110.

The semiconductor substrate 110 may be a silicon substrate, and is integrated with the transmission transistor (not shown) and the charge storages 55a, 55b, 55c, and 55d.

The first photoelectric diode 1200a is formed on the lower insulation layer 80a. The first photoelectric diode 1200a includes a photoelectric conversion layer 1230a. The first photoelectric diode 1200a may be any one of the photoelectric diodes described herein with reference to FIGS. 1-6. The photoelectric conversion layer 1230a may selectively absorb and convert (into electric signals) light in one of infrared, red, blue, and green wavelength spectra of incident light. For example, the first photoelectric diode 1200a may be a blue photoelectric diode.

An intermediate insulation layer 80b is formed on the first photoelectric diode 1200a.

The second photoelectric diode 1200b is formed on the intermediate insulation layer 80b. The second photoelectric 1200b includes a photoelectric conversion layer 1230b. The second photoelectric diode 1200b may be any one of the photoelectric diodes described herein with reference to FIGS. 1-6. The photoelectric conversion layer 1230b may selectively absorb and convert (into electric signals) light in one of infrared, red, blue, and green wavelength spectra of incident light. For example, the second photoelectric diode 1200b may be a green photoelectric diode.

Another intermediate insulation layer 80c is formed on the second photoelectric diode 1200b.

The third photoelectric diode 1200c is formed on the intermediate insulation layer 80c. The third photoelectric diode 1200c includes a photoelectric conversion layer 1230c. The third photoelectric diode 1200c may be any one of the photoelectric diodes described herein with reference to FIGS. 1-6. The photoelectric conversion layer 1230c may selectively absorb and convert (into electric signals) light in one of infrared, red, blue, and green wavelength spectra of incident light. For example, the third photoelectric diode 1200c may be a red photoelectric diode.

The upper insulation layer 80d is formed on the third photoelectric diode 1200c.

The lower insulation layer 80a, the intermediate insulation layers 80b and 80c, and the upper insulation layer 80d have a plurality of through-holes exposing the charge storages 55a, 55b, 55c, and 55d.

The fourth photoelectric diode 1200d is formed on the upper insulation layer 80d. The fourth photoelectric diode 1200d includes a photoelectric conversion layer 1230d. The fourth photoelectric diode 1200d may be any one of the photoelectric diodes described herein with reference to FIGS. 1-6. The photoelectric conversion layer 1230d may selectively absorb light in one of infrared, red, blue, and green wavelength spectra of light. For example, the fourth photoelectric diode 1200d may be an infrared/near infrared photoelectric diode.

Focusing lens (not shown) may be further formed on the fourth photoelectric diode 1200d. The focusing lens may control a direction of incident light and gather the light in one region. The focusing lens may have a shape of, for example, a cylinder or a hemisphere, but is not limited thereto.

In the drawing, the first photoelectric diode 1200a, the second photoelectric diode 1200b, the third photoelectric diode 1200c, and the fourth photoelectric diode 1200d are sequentially stacked, but the present disclosure is not limited thereto, and they may be stacked in various orders.

As described above, the first photoelectric diode 1200a, the second photoelectric diode 1200b, the third photoelectric diode 1200c, and the fourth photoelectric diode 1200d have a stack structure, and thus the size of an image sensor may be reduced to realize a down-sized image sensor.

Figure 19:
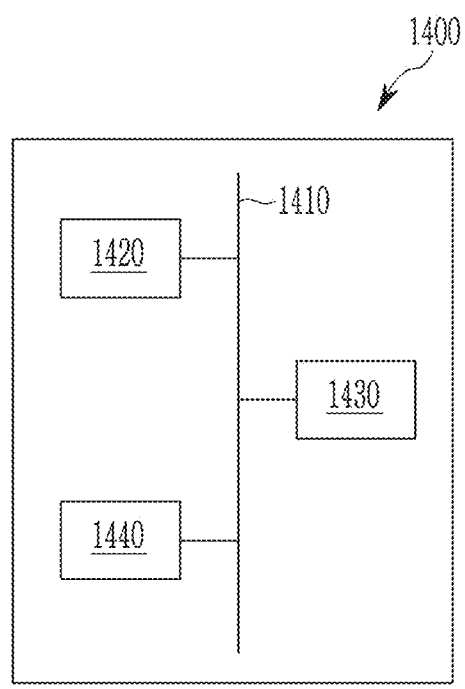
FIG. 19 is a schematic diagram of an electronic device according to some example embodiments.

FIG. 19 is a schematic diagram of an electronic device according to some example embodiments.

As shown in FIG. 19, an electronic device 1400 may include a processor 1420, a memory 1430, and an organic sensor 1440 that are electrically coupled together via a bus 1410. The organic sensor 1440 may be an organic sensor of any of the example embodiments as described herein, and the organic sensor included in the organic sensor 1440 may include any of the photoelectric diodes described herein according to any of the example embodiments of the inventive concepts. The memory 1430, which may be a non-transitory computer readable medium, may store a program of instructions. The processor 1420 may execute the stored program of instructions to perform one or more functions. In some example embodiments, the processor 1420 may be configured to process electric signals generated by the organic sensor 1440. The processor 1420 may be configured to generate an output (e.g., an image to be displayed on a display interface) based on processing the electric signals.

While some example embodiments of photoelectric diodes shown herein include first and second electrodes 10 and 20 facing each other and a photoelectric conversion layer 30 therebetween, it will be understood that in some example embodiments at least the first and second electrodes 10 and 20 may be omitted from the photoelectric diode.

Hereinafter, the some of the aforementioned example embodiments are illustrated in more detail with reference to examples. However, the present disclosure is not limited to these examples.

EXAMPLE I

Reference Example I

ITO is formed by sputtering on a glass substrate to form a 150 nm-thick first electrode. Subsequently, on the first electrode, a compound represented by Chemical Formula 1a (a light-absorption peak ($\lambda_{peak,ab}$)=805 nm, a reflection peak ($\lambda_{peak,re}$)=816 nm) and C60 are co-deposited in a thickness ratio of 2:1 to form a 240 nm-thick photoelectric conversion layer (a light-absorption peak ($\lambda_{peak,ab}$)=760 nm). Then, ITO is formed by sputtering on the photoelectric conversion layer to form a 7 nm-thick second electrode. Then, the second electrode is sealed with a glass plate to manufacture a photoelectric diode.

[Chemical Formula 1a]

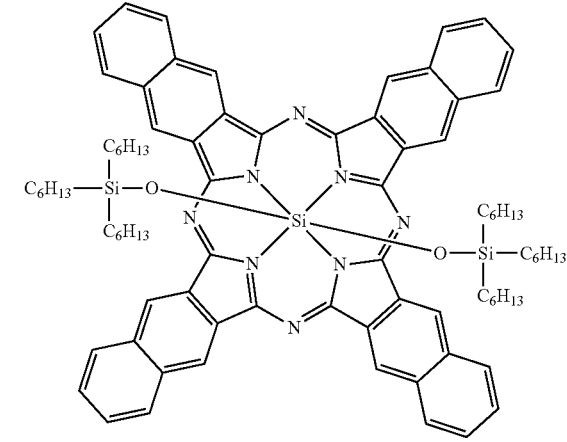

Example 1

ITO is formed by sputtering on a glass substrate to form a 150 nm-thick first electrode. Subsequently, on the first electrode, a compound represented by Chemical Formula 1a and C60 in a thickness ratio of 2:1 are co-deposited to form a 240 nm-thick photoelectric conversion layer. On the photoelectric conversion layer, C60 is thermally deposited to form a 30 nm-thick compensation layer. On the compensation layer, ITO is formed by sputtering to form a second electrode, and the second electrode is sealed by a glass plate to manufacture a photoelectric diode.

Example 2

ITO is formed by sputtering on a glass substrate to form a 150 nm-thick first electrode. Subsequently, on the first electrode, a compound represented by Chemical Formula 1a and C60 in a thickness ratio of 2:1 are co-deposited to form a 240 nm-thick photoelectric conversion layer. On the photoelectric conversion layer, C60 is thermally deposited to form a 30 nm-thick first compensation layer. Subsequently, on the first compensation layer, ITO is formed by sputtering to form a second electrode, and on the second electrode, an aluminum oxide ($Al_2O_3$, a refractive index: 1.6) is thermally deposited to form a 50 nm-thick second compensation layer. The second compensation layer is sealed by a glass plate to manufacture a photoelectric diode.

Example 3

ITO is formed by sputtering on a glass substrate to form a 150 nm-thick first electrode. Subsequently, on the first electrode, a compound represented by Chemical Formula 1a and C60 in a thickness ratio of 2:1 are co-deposited to form a 240 nm-thick photoelectric conversion layer. On the photoelectric conversion layer, C60 is thermally deposited to form a 30 nm-thick first compensation layer. Subsequently, on the first compensation layer, ITO is formed by sputtering to form a second electrode, and on the second electrode, an aluminum oxide ($Al_2O_3$, a refractive index: 1.6) is thermally deposited to form a 70 nm-thick second compensation layer. The second compensation layer is sealed by a glass plate to manufacture a photoelectric diode.

Evaluation I

Optical properties and electrical characteristics of the photoelectric diodes according to Examples 1 to 3 are evaluated and then, compared with those of the photoelectric diode according to Reference Example I.

The optical properties are evaluated in terms of absorptance and reflectance. The absorptance is obtained by measuring optical spectra (transmittance and reflectance) of the photoelectric diodes in a wavelength region of 300 nm to 1100 nm and calculating according to <absorptance=1-transmittance-reflectance>. The transmittance is a light-transmitting ratio, and the reflectance is obtained by measuring a ratio of light reflection at the surface of the photoelectric diodes based on 100% of light reflection on a mirror. The optical properties are evaluated by using a UV-VIS-NIR spectrophotometer (Manufacturer: Shimadzu, Japan).

The electrical characteristics are evaluated from external quantum efficiency (EQE), and the external quantum efficiency (EQE) is measured by using an IPCE measurement system (TNE Tech Co., Ltd., Korea). First, the IPCE measurement system is calibrated by using an Si photodiode (Hamamatsu Photonics K.K., Japan) and equipped respectively with the photoelectric diodes, and then, external quantum efficiency of the photoelectric diodes is measured in a wavelength range of about 400 nm to about 1000 nm. The external quantum efficiency is measured by using a spectral QE (Quantum Efficiency) measurement system (TNE Tech Co., Ltd., Korea).

Figure 20:
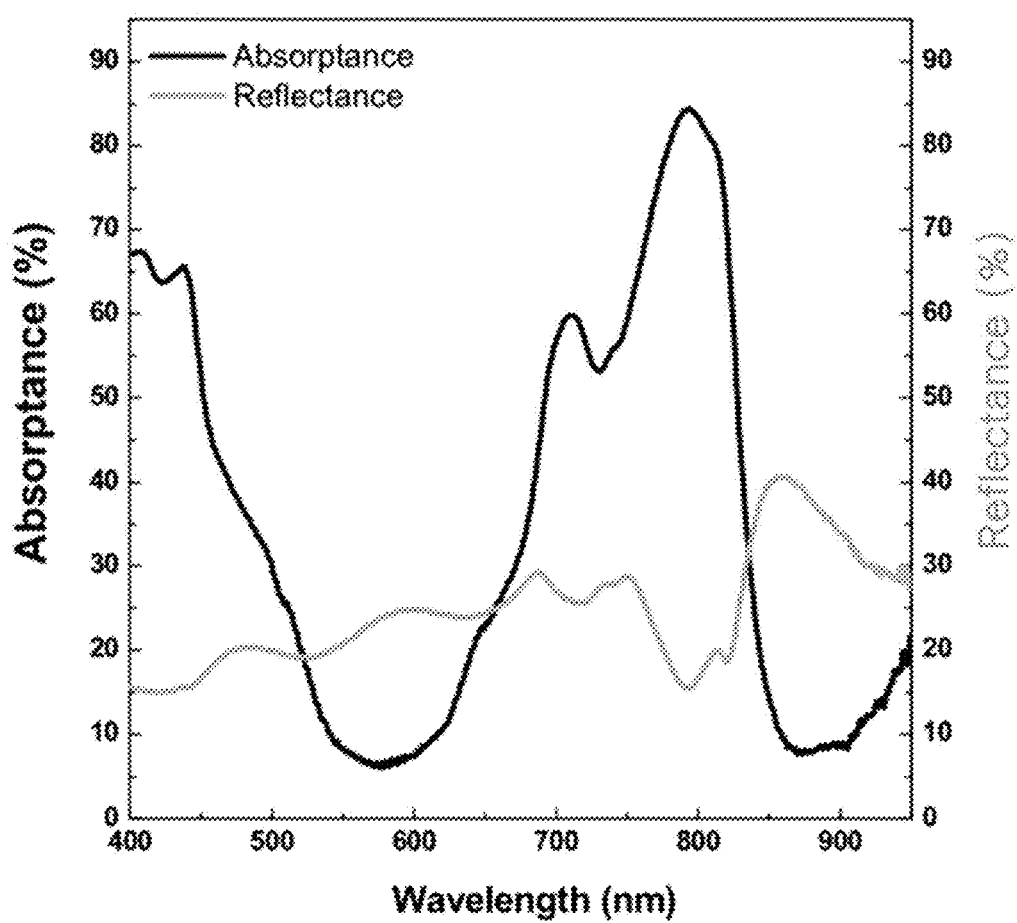
FIG. 20 is a graph showing an optical spectrum of the photoelectric diode according to Example 2.

The results are shown in Table 1 and FIGS. 20 and 20.

Figure 21:
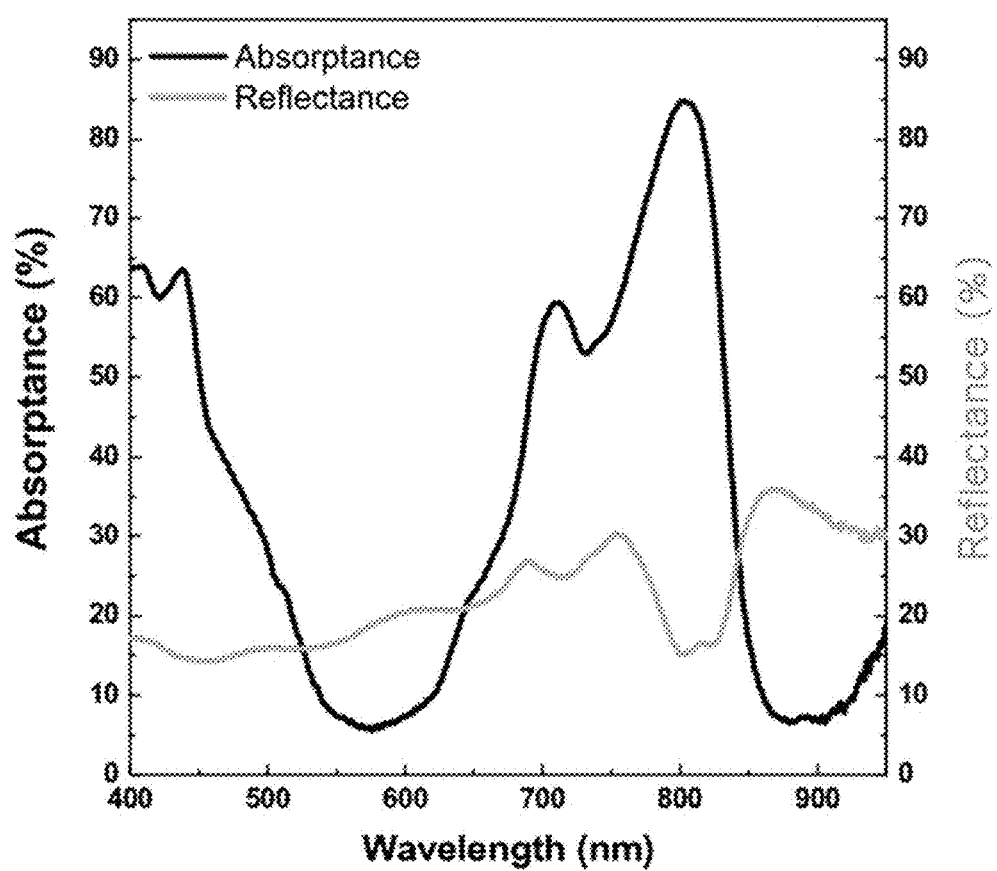
FIG. 21 is a graph showing an optical spectrum of the photoelectric diode according to Example 3.

FIG. 20 is a graph showing an optical spectrum of the photoelectric diode according to Example 2, and FIG. 21 is a graph showing an optical spectrum of the photoelectric diode according to Example 3.

TABLE 1

| | $\lambda_{peak}$ | Absorbance (@$\lambda_{peak}$, %) | Reflectance (@$\lambda_{peak}$, %) | EQE (@$\lambda_{peak}$, %) | EQE (@810 nm, %) |
|---|---|---|---|---|---|
| Example 1 | 780 | 79 | 19 | 68 | 56 |
| Example 2 | 790 | 84 | 16 | 65 | 58 |
| Example 3 | 800 | 85 | 15 | 63 | 56 |
| Reference Example I | 760 | 71 | 20 | 46 | 31 |

\* $\lambda_{peak}$: light-absorption peak wavelength
\* EQE: @ 3 V

Referring to Table 1, the photoelectric diodes according to Examples 1 to 3 exhibit an increasing difference between absorptance and reflectance at $\lambda_{peak}$ and thus improved electrical characteristics compared with the photoelectric diode according to Reference Example I.

In addition, referring to FIGS. 20 and 21, the photoelectric diodes according to Examples 2 and 3 also exhibit an increasing difference between absorptance and reflectance at $\lambda_{peak}$.

EXAMPLE II

Reference Example II

ITO is formed by sputtering on a glass substrate to form a 150 nm-thick first electrode. Subsequently, on the first electrode, a compound represented by Chemical Formula 1a and C60 in a thickness ratio of 0.83:1 are co-deposited to form a 220 nm-thick photoelectric conversion layer (a light-absorption peak ($\lambda_{peak,ab}$)=780 nm, a reflection peak ($\lambda_{peak,re}$)=809 nm). Then, ITO is formed by sputtering on the photoelectric conversion layer to form a second electrode. Then, the second electrode is sealed with a glass plate to manufacture a photoelectric diode.

Example 4

ITO is formed by sputtering on a glass substrate to form a 150 nm-thick first electrode. Subsequently, on the first electrode, a compound represented by Chemical Formula 1a and C60 in a thickness ratio of 0.83:1 are co-deposited to form a 220 nm-thick photoelectric conversion layer. On the photoelectric conversion layer, C60 is thermally deposited to form a 30 nm-thick compensation layer. Subsequently, on the compensation layer, ITO is formed by sputtering to form a second electrode, and the second electrode is sealed by a glass plate to manufacture a photoelectric diode.

Example 5

ITO is formed by sputtering on a glass substrate to form a 150 nm-thick first electrode. Subsequently, on the first electrode, a compound represented by Chemical Formula 1a and C60 in a thickness ratio of 0.83:1 are co-deposited to form a 220 nm-thick photoelectric conversion layer. On the photoelectric conversion layer, C60 is thermally deposited to form a 30 nm-thick first compensation layer. Subsequently, on the first compensation layer, ITO is formed by sputtering to form a second electrode, and on the second electrode, an aluminum oxide is thermally deposited to form a 50 nm-thick second compensation layer. The second compensation layer is sealed by a glass plate to manufacture a photoelectric diode.

Evaluation II

Light absorption characteristics and electrical characteristics of the photoelectric diodes according to Examples 4 and 5 are evaluated and compared with those of the photoelectric diode according to Reference Example II.

Figure 22:
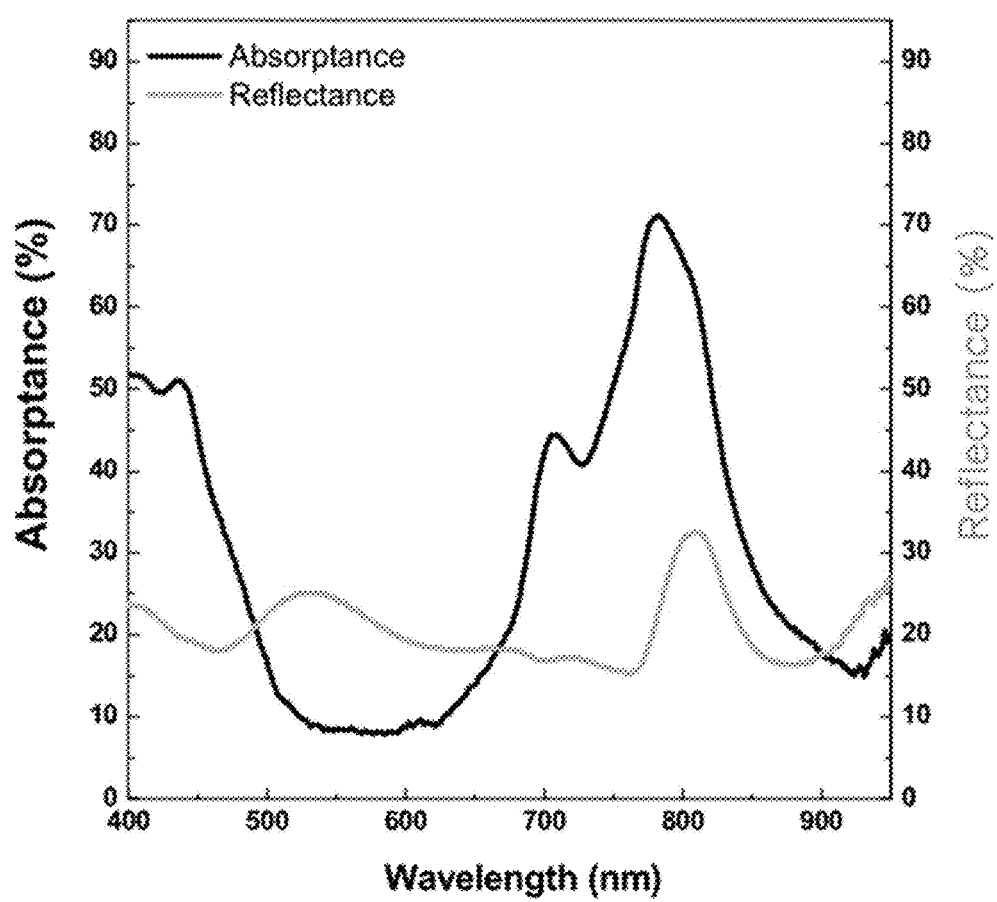
FIG. 22 is a graph showing an optical spectrum of the photoelectric diode according to Reference Example II.
Figure 23:
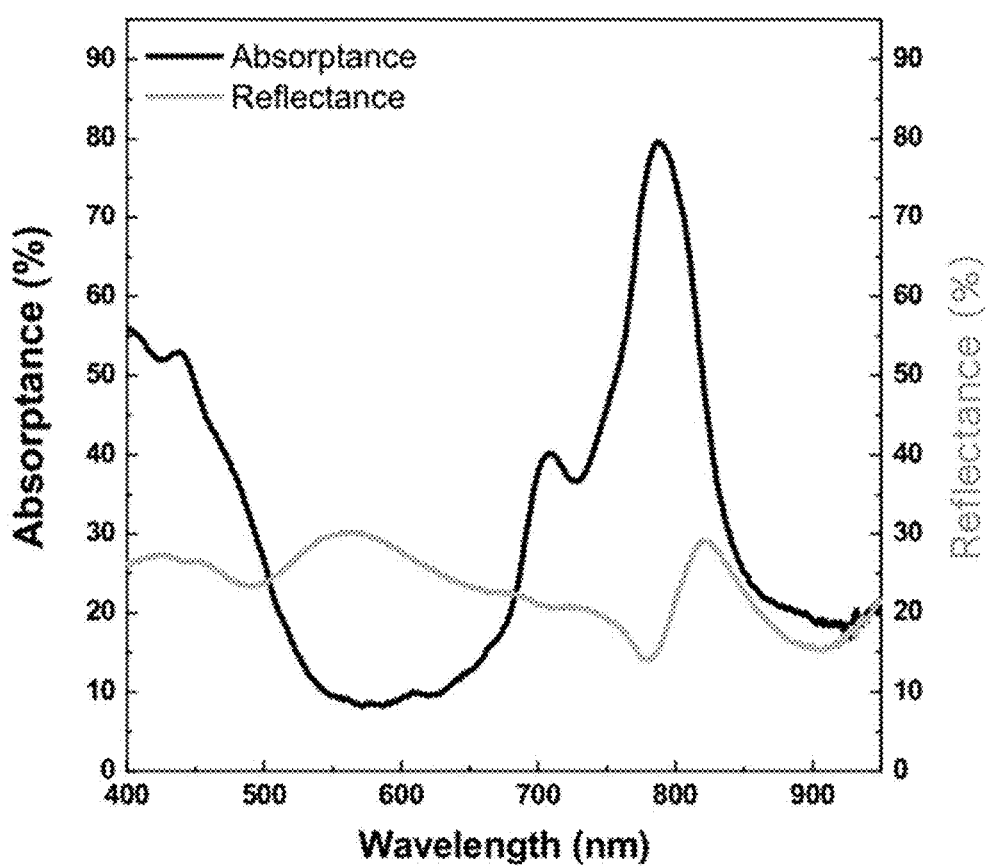
FIG. 23 is a graph showing an optical spectrum of the photoelectric diode according to Example 4.
Figure 24:
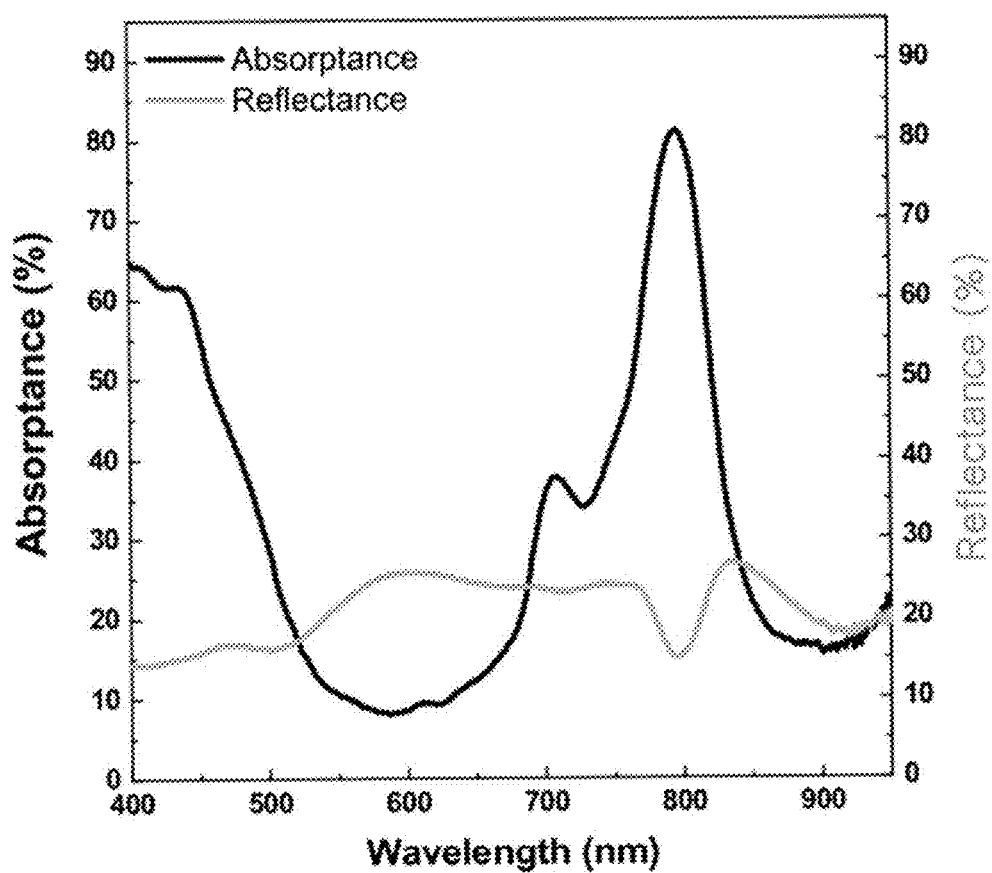
FIG. 24 is a graph showing an optical spectrum of the photoelectric diode according to Example 5.

The results are shown in Table 2 and FIGS. 22, 23, and 24.

FIG. 22 is a graph showing an optical spectrum of the photoelectric diode according to Reference Example II, FIG. 23 is a graph showing an optical spectrum of the photoelectric diode according to Example 4, and FIG. 24 is a graph showing an optical spectrum of the photoelectric diode according to Example 5.

TABLE 2

| | $\lambda_{peak}$ | Absorbance (@$\lambda_{peak}$, %) | Reflectance (@$\lambda_{peak}$, %) | EQE (@$\lambda_{peak}$, %) | EQE (@810 nm, %) |
|---|---|---|---|---|---|
| Example 4 | 790 | 79 | 16 | 70 | 58 |
| Example 5 | 800 | 80 | 16 | 71 | 63 |
| Reference Example II | 780 | 71 | 21 | 53 | 47 |

Referring to Table 2 and FIGS. 22, 23, and 24, the photoelectric diodes according to Examples 4 and 5 exhibit an increasing difference between absorptance and reflectance at $\lambda_{peak}$ and thus improved electrical characteristics compared with the photoelectric diode according to Reference Example II.

EXAMPLE III

Reference Example III

ITO is formed by sputtering on a glass substrate to form a 150 nm-thick first electrode. Subsequently, on the first electrode, a compound represented by Chemical Formula 1b (a light-absorption peak ($\lambda_{peak,ab}$)=826 nm, a reflection peak ($\lambda_{peak,re}$)=817 nm) and C60 in a thickness ratio of 1:1 are co-deposited to form an 150 nm-thick photoelectric conversion layer (a light-absorption peak ($\lambda_{peak,ab}$)=776 nm, a reflection peak ($\lambda_{peak,re}$)=805 nm). Then, ITO is formed by sputtering on the photoelectric conversion layer to form a 7 nm-thick second electrode. Then, the second electrode is sealed by a glass plate to manufacture a photoelectric diode.

[Chemical Formula 1b]

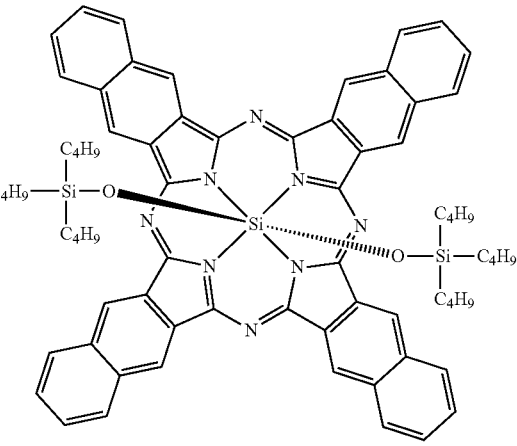

Example 6

ITO is formed by sputtering on a glass substrate to form a 150 nm-thick first electrode. Subsequently, on the first electrode, a compound represented by Chemical Formula 1b and C60 in a thickness ratio of 1:1 are co-deposited to form a 150 nm-thick photoelectric conversion layer. Then, ITO is formed by sputtering on the photoelectric conversion layer to form a second electrode. Subsequently, on the second electrode, C60 is thermally deposited to form a 30 nm-thick first compensation layer, and on the first compensation layer, an aluminum oxide is thermally deposited to form a 50 nm-thick second compensation layer. The second compensation layer is sealed with a glass plate to manufacture a photoelectric diode.

Example 7

ITO is formed by sputtering on a glass substrate to form a 150 nm-thick first electrode. Subsequently, on the first electrode, a compound represented by Chemical Formula 1b and C60 in a thickness ratio of 1:1 are co-deposited to form a 180 nm thick photoelectric conversion layer. On the photoelectric conversion layer, C60 is thermally deposited to form a 30 nm-thick first compensation layer. Subsequently, on the compensation layer, ITO is formed by sputtering to form a second electrode, and on the second electrode, an aluminum oxide is thermally deposited to form a 50 nm-thick second compensation layer. The second compensation layer is sealed by a glass plate to manufacture a photoelectric diode.

Evaluation III

Light absorption characteristics and electrical characteristics of the photoelectric diodes according to Examples 6 and 7 are evaluated and compared with those of the photoelectric diode according to Reference Example III.

Figure 25:
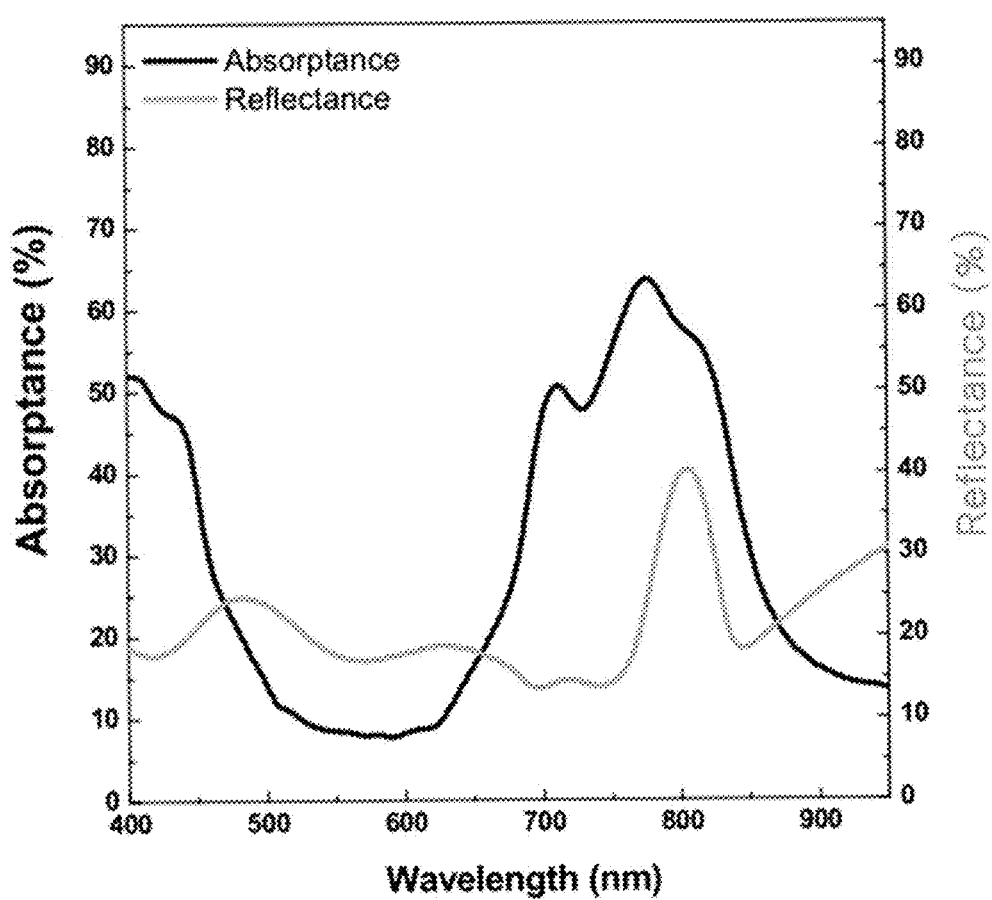
FIG. 25 is a graph showing an optical spectrum of the photoelectric diode according to Reference Example III.
Figure 26:
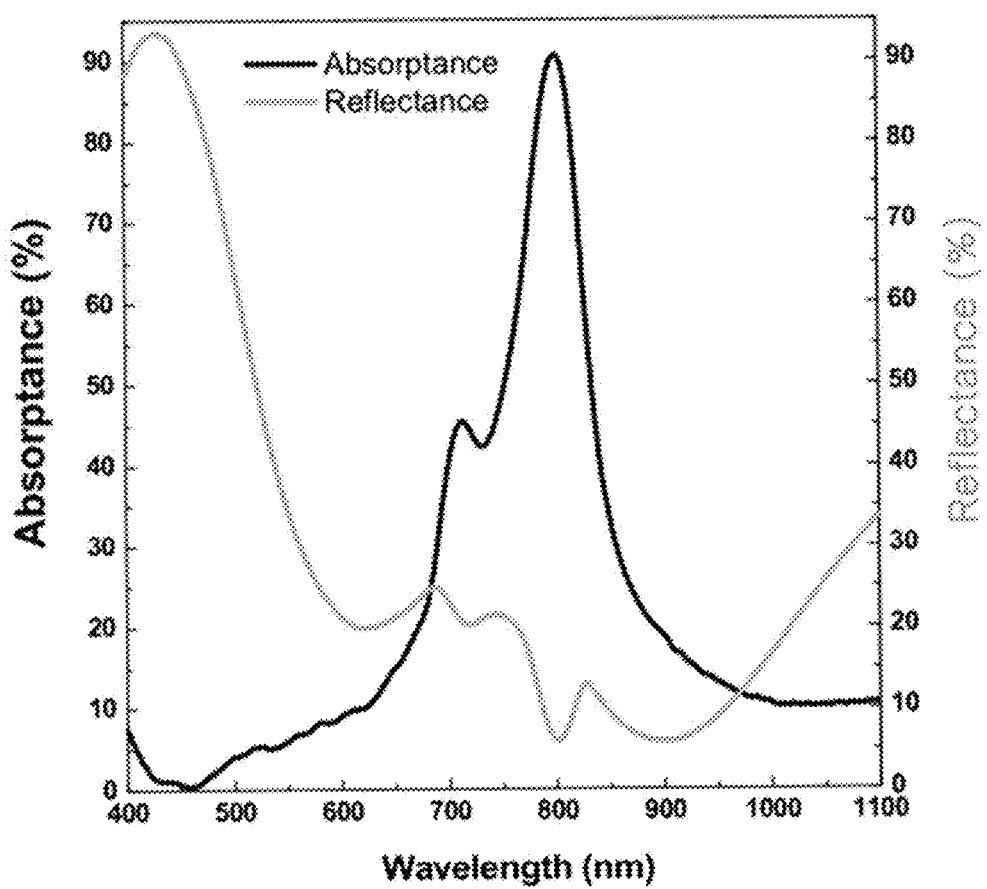
FIG. 26 is a graph showing an optical spectrum of the photoelectric diode according to Example 6.
Figure 27:
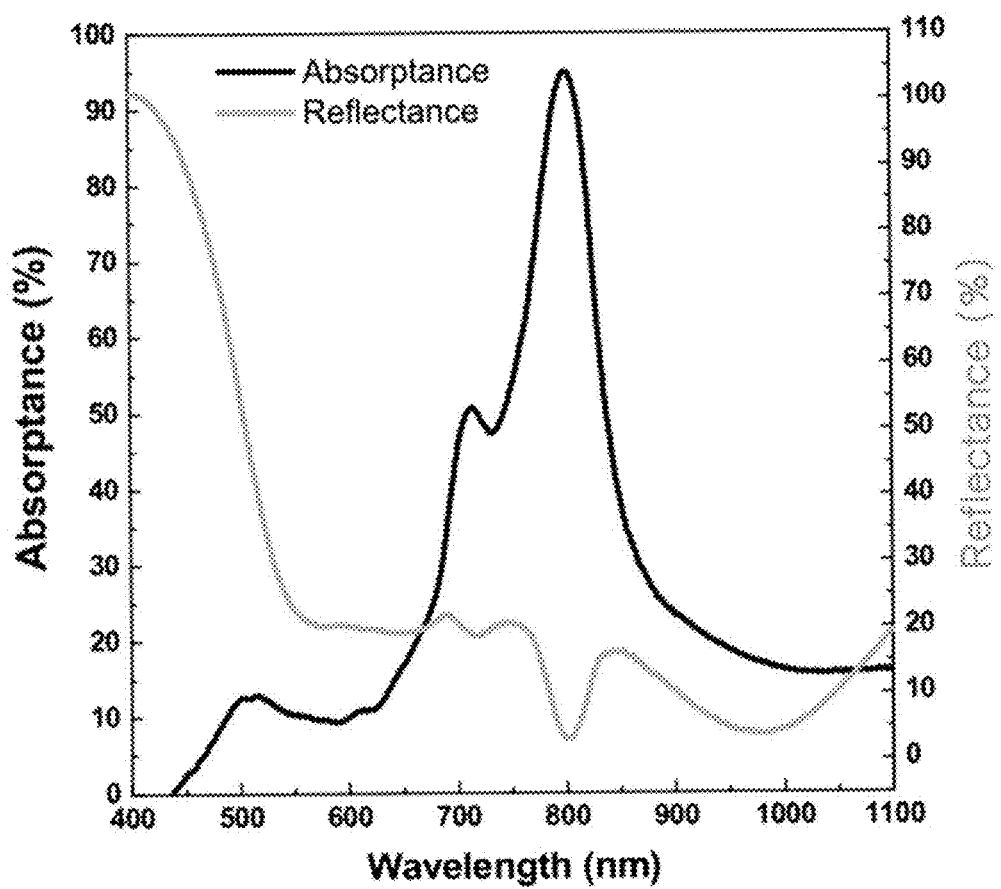
FIG. 27 is a graph showing an optical spectrum of the photoelectric diode according to Example 7.

The results are shown in Table 3 and FIGS. 25, 26, and 27.

FIG. 25 is a graph showing an optical spectrum of the photoelectric diode according to Reference Example III, FIG. 26 is a graph showing an optical spectrum of the photoelectric diode according to Example 6, and FIG. 27 is a graph showing an optical spectrum of the photoelectric diode according to Example 7.

TABLE 3

|  | $\lambda_{peak}$ | Absorbance (@$\lambda_{peak}$, %) | Reflectance (@$\lambda_{peak}$, %) | EQE (@$\lambda_{peak}$, %) | EQE (@810 nm, %) |
| --- | --- | --- | --- | --- | --- |
| Example 6 | 800 | 91 | 6 | 61 | 60 |
| Example 7 | 800 | 95 | 3 | 62 | 60 |
| Reference Example III | 776 | 63 | 20 | 38 | 35 |

Referring to Table 3 and FIGS. 25, 26, and 27, the photoelectric diodes according to Examples 6 and 7 exhibit an increasing difference between absorptance and reflectance at $\lambda_{peak}$ and thus improved electrical characteristics compared with the photoelectric diode according to Reference Example III.

While this disclosure has been described in connection with what is presently considered to be practical example embodiments, it is to be understood that the inventive concepts are not limited to the disclosed example embodiments. On the contrary, it is intended to cover various modifications and equivalent arrangements included within the spirit and scope of the appended claims.

What is claimed is:

1. A photoelectric diode, comprising:
a first electrode and a second electrode facing each other;
a photoelectric conversion layer between the first electrode and the second electrode, the photoelectric conversion layer including at least one p-type semiconductor and at least one n-type semiconductor to provide a pn junction, one the photoelectric conversion layer associated with a first optical spectrum having a light-absorption peak at a first wavelength and a reflection peak at a second wavelength, the first wavelength and the second wavelength both within a wavelength region of about 750 nm to about 1200 nm; and
a compensation layer on the photoelectric conversion layer, the compensation layer configured to compensate light-absorption and reflection characteristics of the photoelectric diode in one or more wavelength regions,
wherein the photoelectric diode is associated with a second optical spectrum having a light-absorption peak at a third wavelength, the third wavelength is within the wavelength region of about 750 nm to about 1200 nm, the third wavelength different from the first wavelength.

2. The photoelectric diode of claim 1, wherein a difference between the first wavelength and the second wavelength is about 1 nm to about 50 nm.

3. The photoelectric diode of claim 1, wherein the third wavelength is a longer wavelength than the first wavelength.

4. The photoelectric diode of claim 1, wherein the third wavelength is a longer wavelength than the first wavelength by about 5 nm to about 50 nm.

5. The photoelectric diode of claim 1, wherein a difference between absorptance and reflectance of the photoelectric diode at the third wavelength is larger than a difference between absorptance and reflectance of the photoelectric conversion layer at the first wavelength.

6. The photoelectric diode of claim 1, wherein the compensation layer includes a charge transporting light-absorbing material.

7. The photoelectric diode of claim 1, wherein the compensation layer is between the second electrode and the photoelectric conversion layer.

8. The photoelectric diode of claim 1, wherein the compensation layer includes
a first compensation layer including a charge transporting light-absorbing material, and
a second compensation layer including a material having a refractive index of about 1.5 to about 2.5.

9. The photoelectric diode of claim 8, wherein
the first compensation layer is on a first surface of the second electrode, and
the second compensation layer is on a second, opposite surface of the second electrode.

10. The photoelectric diode of claim 8, wherein
the first compensation layer and the second compensation layer are on a common surface of the second electrode, and
the first compensation layer is between the second electrode and the second compensation layer.

11. The photoelectric diode of claim 1, wherein the photoelectric diode is associated with the second optical spectrum having a reflection peak at a fourth wavelength, the fourth wavelength is within the wavelength region of about 750 nm to about 1200 nm, the fourth wavelength different from the second wavelength.

12. The photoelectric diode of claim 1, wherein
one of the at least one p-type semiconductor and the at least one n-type semiconductor is an organic light-absorbing material, the organic light-absorbing material associated with a third optical spectrum having a light-absorption peak at a fifth wavelength and a reflection peak at a sixth wavelength, the fifth wavelength and the sixth wavelength within the wavelength region of about 750 nm to about 1200 nm, and
a difference between the fifth wavelength and the sixth wavelength is less than or equal to about 50 nm.

13. The photoelectric diode of claim 12, wherein the fifth wavelength and the sixth wavelength are within a wavelength region of about 750 nm to about 850 nm.

14. The photoelectric diode of claim 1, wherein the first wavelength and the second wavelength are within a wavelength region of about 750 nm to about 850 nm.

15. The photoelectric diode of claim 1, wherein the third wavelength is within a wavelength region of about 755 nm to about 900 nm.

16. An organic sensor comprising the photoelectric diode of claim 1.

17. The photoelectric diode of claim 9, further comprising:
a first charge auxiliary layer between the first electrode and the photoelectric conversion layer, and
a second charge auxiliary layer between the second electrode and the photoelectric conversion layer.

18. A photoelectric diode, comprising:
a first electrode;
a photoelectric conversion layer including at least one p-type semiconductor and at least one n-type semiconductor to provide a pn junction, one of the at least one p-type semiconductor and the at least one n-type semiconductor being an organic light-absorbing material; and
a second electrode,
wherein the photoelectric conversion layer is associated with a first optical spectrum having a light-absorption peak at a first wavelength and a reflection peak at a second wavelength, the first wavelength and the second wavelength both within a wavelength region of about 750 nm to about 1200 nm, wherein the photoelectric diode further includes a compensation layer on the photoelectric conversion layer,
wherein the photoelectric diode is associated with a second optical spectrum having a light-absorption peak at a third wavelength within the wavelength region of about 750 nm to about 1200 nm,
wherein a difference between absorptance and reflectance of the photoelectric diode at the third wavelength is larger than a difference between absorptance and reflectance of the photoelectric conversion layer at the first wavelength.

19. The photoelectric diode of claim 18, wherein a difference between the first wavelength and the second wavelength is about 1 nm to about 50 nm.

20. The photoelectric diode of claim 18, wherein the first wavelength and the second wavelength are within a wavelength region of about 750 nm to about 850 nm.

21. The photoelectric diode of claim 18, wherein the third wavelength is within a wavelength region of about 755 nm to about 900 nm.

22. The photoelectric diode of claim 18, wherein the photoelectric diode is associated with the second optical spectrum having a reflection peak at a fourth wavelength, the fourth wavelength is within the wavelength region of about 750 nm to about 1200 nm, the fourth wavelength different from the second wavelength.

23. The photoelectric diode of claim 18, wherein the organic light-absorbing material is associated with a third optical spectrum having a light-absorption peak at a fifth wavelength and a reflection peak at a sixth wavelength, the fifth wavelength and the sixth wavelength within the wavelength region of about 750 nm to about 1200 nm, and
a difference between the fifth wavelength and the sixth wavelength is less than or equal to about 50 nm.

24. The photoelectric diode of claim 23, wherein the fifth wavelength and the sixth wavelength are within a wavelength region of about 750 nm to about 850 nm.

25. The photoelectric diode of claim 18, wherein the compensation layer includes a charge transporting light-absorbing material.

26. The photoelectric diode of claim 18, wherein
the compensation layer includes
a first compensation layer including a charge transporting light-absorbing material, and
a second compensation layer including a material having a refractive index of about 1.5 to about 2.5.

27. The photoelectric diode of claim 26, wherein
the first compensation layer is between the photoelectric conversion layer and the second electrode and is on a first surface of the second electrode, and
the second compensation layer is on a second, opposite surface of the second electrode.

28. The photoelectric diode of claim 26, wherein
the first compensation layer and the second compensation layer are on a common surface of the second electrode, and
the first compensation layer is between the second electrode and the second compensation layer.

29. An organic sensor comprising the photoelectric diode of claim 18.

30. The photoelectric diode of claim 27, further comprising:
a first charge auxiliary layer between the first electrode and the photoelectric conversion layer, and
a second charge auxiliary layer between the second electrode and the photoelectric conversion layer.

31. An organic sensor, comprising:
a semiconductor substrate; and
a first photoelectric diode on the semiconductor substrate, the first photoelectric diode configured to absorb and convert a particular wavelength spectrum of incident light into electric signals, the first photoelectric diode including
a first electrode and a second electrode facing each other,
a photoelectric conversion layer between the first electrode and the second electrode, the photoelectric conversion layer including at least one p-type semiconductor and at least one n-type semiconductor to provide a on junction, the photoelectric conversion layer associated with a first optical spectrum having a light-absorption peak at a first wavelength and a reflection peak at a second wavelength, the first wavelength and the second wavelength both within a wavelength region of about 750 nm to about 1200 nm, and
a compensation layer on the photoelectric conversion layer,
wherein the first photoelectric diode is associated with a second optical spectrum having a light-absorption peak at a third wavelength, the third wavelength is within the wavelength region of about 750 nm to about 1200 nm, the third wavelength different from the first wavelength, a difference between absorptance and reflectance of the first photoelectric diode at the third wavelength is larger than a difference between absorptance and reflectance of the photoelectric conversion layer at the first wavelength.

32. The organic sensor of claim 31, further comprising:
a plurality of photoelectric diodes on the semiconductor substrate, each photoelectric diode of the plurality of photoelectric diodes configured to absorb and convert a different wavelength spectrum of incident light into electric signals, the plurality of photoelectric diodes including the first photoelectric diode.

33. The organic sensor of claim 32, wherein the plurality of photoelectric diodes are stacked vertically on the semiconductor substrate, such that the plurality of photoelectric diodes overlap each other in a direction extending perpendicular to a top surface of the semiconductor substrate.

34. The organic sensor of claim 33, wherein one photoelectric diode of the plurality of photoelectric diodes overlaps with a limited portion of another photoelectric diode of the plurality of photoelectric diodes in the direction extending perpendicular to the top surface of the semiconductor substrate.

35. The organic sensor of claim 32, wherein the plurality of photoelectric diodes are arranged horizontally on the semiconductor substrate, such that the plurality of photoelectric diodes overlap each other in a direction extending parallel to a top surface of the semiconductor substrate.

36. The organic sensor of claim 31, wherein the particular wavelength spectrum of incident light includes an infrared or near-infrared wavelength spectrum of incident light.

37. The organic sensor of claim 31, further comprising:
a photo-sensing device integrated in the semiconductor substrate, the photo-sensing device configured to convert a separate wavelength spectrum of incident light into electric signals.

38. The organic sensor of claim 37, further comprising:
a color filter configured to selectively transmit another wavelength spectrum of incident light to the photo-sensing device, the another wavelength spectrum of incident light including at least the separate wavelength spectrum of incident light, such that the photo-sensing device is configured to absorb the separate wavelength spectrum of incident light.

39. The organic sensor of claim 38, wherein the first photoelectric diode is between the color filter and the photo-sensing device.

40. The organic sensor of claim 38, wherein the photo-sensing device is between the color filter and the first photoelectric diode.

41. An electronic device comprising the organic sensor of claim 31.

* * * * *